(12) United States Patent
Currie et al.

(10) Patent No.: US 6,960,781 B2
(45) Date of Patent: Nov. 1, 2005

(54) SHALLOW TRENCH ISOLATION PROCESS

(75) Inventors: Matthew T. Currie, Windham, NH (US); Anthony J. Lochtefeld, Somerville, MA (US)

(73) Assignee: Amberwave Systems Corporation, Salem, NH (US)

( * ) Notice: Subject to any disclaimer, the term of this patent is extended or adjusted under 35 U.S.C. 154(b) by 39 days.

(21) Appl. No.: 10/794,010

(22) Filed: Mar. 5, 2004

(65) Prior Publication Data
US 2004/0173812 A1 Sep. 9, 2004

Related U.S. Application Data

(60) Provisional application No. 60/452,794, filed on Mar. 7, 2003.

(51) Int. Cl.$^7$ ................................................ H01L 29/06
(52) U.S. Cl. ........................... 257/19; 257/18; 257/338; 257/E29.193
(58) Field of Search ........................... 257/19, 18, 338, 257/E29.193

(56) References Cited

U.S. PATENT DOCUMENTS

| | | | |
|---|---|---|---|
| 4,354,898 A | 10/1982 | Coldren et al. | 156/647 |
| 4,547,956 A | 10/1985 | Bouadma et al. | 29/569 |
| 4,675,074 A | 6/1987 | Wada et al. | 156/647 |
| 4,767,246 A | 8/1988 | Bridges et al. | 156/643 |
| 5,089,872 A | 2/1992 | Ozturk et al. | |
| 5,242,847 A | 9/1993 | Ozturk et al. | |
| 5,254,873 A | 10/1993 | Poon et al. | 257/751 |
| 5,393,375 A | 2/1995 | MecDonald et al. | 156/643 |
| 5,516,721 A | 5/1996 | Galli et al. | 437/67 |
| 5,523,243 A | 6/1996 | Mohammad | 437/31 |
| 5,624,529 A | 4/1997 | Shul et al. | 438/718 |
| 5,698,869 A | 12/1997 | Yoshimi et al. | 257/192 |
| 5,847,419 A | 12/1998 | Imai et al. | 257/192 |
| 6,025,234 A | 2/2000 | Chou | 438/279 |
| 6,051,478 A | 4/2000 | Ibok | 438/424 |
| 6,069,091 A | 5/2000 | Chang et al. | 438/719 |
| 6,191,432 B1 | 2/2001 | Sugiyama et al. | 257/19 |
| 6,222,218 B1 | 4/2001 | Jammy et al. | 257/301 |
| 6,228,694 B1 | 5/2001 | Doyle et al. | |
| 6,235,568 B1 | 5/2001 | Murthy et al. | |
| 6,239,002 B1 | 5/2001 | Jang et al. | 438/435 |
| 6,245,684 B1 | 6/2001 | Zhao et al. | 438/704 |
| 6,245,691 B1 | 6/2001 | Jang et al. | 438/787 |
| 6,281,532 B1 | 8/2001 | Doyle et al. | |
| 6,326,664 B1 | 12/2001 | Chau et al. | |
| 6,350,993 B1 | 2/2002 | Chu et al. | 257/19 |
| 6,352,892 B2 | 3/2002 | Jammy et al. | 438/244 |
| 6,387,764 B1 | 5/2002 | Curtis et al. | 438/296 |
| 6,455,894 B1 | 9/2002 | Matsumoto et al. | 257/347 |
| 6,455,912 B1 | 9/2002 | Kim et al. | 257/506 |
| 6,483,156 B1 | 11/2002 | Adkisson et al. | 257/401 |
| 6,498,369 B1 | 12/2002 | Jain et al. | 257/194 |
| 6,504,173 B2 | 1/2003 | Hsu et al. | 257/60 |
| 6,563,152 B2 * | 5/2003 | Roberds et al. | 257/288 |
| 6,583,000 B1 | 6/2003 | Hsu et al. | 438/222 |

(Continued)

FOREIGN PATENT DOCUMENTS

| | | |
|---|---|---|
| EP | 0 552 671 A2 | 7/1993 |
| EP | 0 829 908 | 3/1998 |
| EP | 0 987 765 A2 | 3/2000 |

OTHER PUBLICATIONS

Baker et al., "STI TEOS Densification for Furnaces and RTP Tools," *Proceedings of the IEEE/SEMI Advanced Semiconductor Manufacturing Conference and Workshop*, pp. 394–399 (1999).

(Continued)

*Primary Examiner*—David Nelms
*Assistant Examiner*—Tu-Tu Ho
(74) *Attorney, Agent, or Firm*—Goodwin Procter, LLP

(57) ABSTRACT

A structure including a transistor and a trench structure, with the trench structure inducing only a portion of the strain in a channel region of the transistor.

40 Claims, 18 Drawing Sheets

U.S. PATENT DOCUMENTS

| | | | |
|---|---|---|---|
| 6,602,798 B1 | 8/2003 | Thakur et al. | 438/762 |
| 6,605,498 B1 | 8/2003 | Murthy et al. | |
| 6,621,131 B2 | 9/2003 | Murthy et al. | 257/408 |
| 6,627,506 B2 | 9/2003 | Kuhn et al. | 438/359 |
| 6,657,223 B1 | 12/2003 | Wang et al. | 257/19 |
| 6,703,648 B1 | 3/2004 | Xiang et al. | |
| 6,724,019 B2 * | 4/2004 | Oda et al. | 257/195 |
| 6,743,684 B2 | 6/2004 | Liu | |
| 2002/0005561 A1 | 1/2002 | Kobayashi et al. | 257/510 |
| 2002/0045325 A1 | 4/2002 | Kuhn et al. | 438/424 |
| 2002/0063292 A1 | 5/2002 | Armstrong et al. | |
| 2002/0102814 A1 | 8/2002 | Olsen | 438/424 |
| 2002/0125475 A1 | 9/2002 | Chu et al. | 257/55 |
| 2002/0171077 A1 | 11/2002 | Chu et al. | 257/19 |
| 2002/0190284 A1 | 12/2002 | Murthy et al. | |
| 2003/0049893 A1 | 3/2003 | Currie et al. | 438/172 |
| 2003/0089901 A1 | 5/2003 | Fitzgerald | 257/19 |
| 2003/0102490 A1 | 6/2003 | Kubo et al. | 257/192 |
| 2004/0007724 A1 | 1/2004 | Murthy et al. | |
| 2004/0014276 A1 | 1/2004 | Murthy et al. | |
| 2004/0070035 A1 | 4/2004 | Murthy et al. | |
| 2004/0084735 A1 | 5/2004 | Murthy et al. | |
| 2004/0119101 A1 | 6/2004 | Schrom et al. | |
| 2004/0142545 A1 | 7/2004 | Ngo et al. | |
| 2004/0173815 A1 | 9/2004 | Yeo et al. | |

OTHER PUBLICATIONS

Burkhardt et al., "Reduction of Oxide Tub Isolation Stress Using a Silicon Nitride Liner," *Journal of the Electrochemical Society*, vol. 147, No. 9, pp. 3482–3486 (2000).

Chung et al., "Novel shallow trench isolation process using flowable oxide CVD for sub–100nm DRAM," *IEEE International Electron Devices Meeting Technical Digest*, pp. 233–236 (2002).

Currie et al., "Controlling threading dislocation densities in Ge on Si using graded SiGe layers and chemical—mechanical polishing," *Applied Physics Letters*, vol. 72, No. 14, pp. 1718–1720 (1998).

Davari et al., "A Variable–Size Shallow Trench Isolation (STI) Technology with Diffused Sidewall Doping for Submicron CMOS," *IEEE International Electron Devices Meeting Technical Digest*, pp. 92–95 (1988).

Dombrowski et al., "Determination of Stress in Shallow Trench Isolation for Deep Submicron MOS Devices by UV Raman Spectroscopy," *IEEE International Electron Devices Meeting Technical Digest*, pp. 357–360 (1999).

En et al., "Reduction of STI/active Stress on 0.18um SOI Devices Through Modification of STI Process," *Proceedings of the 2001 IEEE International SOI Conference*, pp. 85–86 (2001).

Gardeniers et al., "LPCVD silicon–rich silicon nitride films for applications in micromechanics, studied with statistical experimental design," *Journal of Vacuum Science and Technology of America*, vol. 14, No. 5, pp. 2879–2892 (1996).

Ge et al., "Process–Strained Si (PSS) CMOS Technology Featuring 3D Strain Engineering," *IEEE International Electron Devices Meeting Technical Digest*, pp. 73–76 (2003).

Gopinath et al., "STI Stress–Induced Increase in Reverse Bias Junction Capacitance," *IEEE Electron Device Letters*, vol. 23, No. 6, pp. 312–314 (2002).

Gunde et al., "The relationship between the macroscopic properties of PECVD silicon nitride and oxynitride layers and the characteristics of their networks," *Applied Physics A*, vol. 74, pp. 181–186 (2002).

Habermehl, "Stress relaxation in Si–rich silicon nitride thin films," *Journal of Applied Physics*, vol. 83, No. 9, pp. 4672–4677 (1998).

Hamada et al., "A New Aspect of Mechanical Stress Effects in Scaled MOS Devices," *IEEE Transactions on Electron Devices*, vol. 38, No. 4, pp. 895–900 (1991).

Heo et al., "Void Free and Low Stress Shallow Trench Isolation Technology using P–SOG for sub 0.1 um Device," *2002 Symposium on VLSI Technology Digest of Technical Papers*, pp. 132–133 (2002).

Hu, "Stress from isolation trenches in silicon substrates," *Journal of Applied Physics*, vol. 67, No. 2, pp. 1092–1101 (1990).

Ishimaru et al., "Mechanical Stress Induced MOSFET Punch–through and Process Optimization for Deep Submicron TEOS–$O_3$ filled STI Device," *1997 Symposium on VLSI Technology Digest of Technical Papers*, pp. 123–124 (1997).

Ito et al., "Mechanical Stress Effect of Etch–Stop Nitride and its Impact on Deep Submicron Transistor Design," *IEEE International Electron Devices Meeting Technical Digest*, pp. 247–250 (2000).

Jeon et al., "Generation of trench dislocation in 0.25um logic technology and its elimination," *Proceedings of the $6^{th}$International Conference on VLSI and CAD (ICVC 99)*, pp. 463–465 (1999).

Jeon et al., "The impact of STI mechanical stress on the device performance of 90nm technology node with different substrates and isolation processes," *Proceedings of the 2003 IEEE International SOI Conference*, pp. 164–165 (2003).

Kim et al., "High–resolution and strained measurement in shallow trench isolation structures using dynamic electron diffraction," *Applied Physics Letters*, vol. 84, No. 12, pp. 2181–2183 (2004).

Kim et al., "Modeling of Cumulative Thermo–Mechanical Stress (CTMS) Produced by the Shallow Trench Isolation Process for 1Gb DRAM and beyond", *IEEE International Electron Devices Meeting Technical Digest*, pp. 145–148, (1998).

Koster et al., "Fabrication and characterisation of SiGe based In–Plane–Gate Transistors," *Microelectronic Engineering*, vol. 35, pp. 301–304 (1997).

Krivokapic et al., "Locally Strained Ultra–Thin Channel 25nm Narrow FDSOI Devices with Metal Gate and Mesa Isolation," *IEEE International Electron Devices Meeting Technical Digest*, pp. 445–448 (2003).

Lau et al., "Stability of electrical properties of nitrogen–rich, silicon–rich, and stoichiometric silicon nitride films," *Journal of Applied Physics*, vol. 66, No. 6, pp. 2765–2767 (1989).

Lee et al., "An Optimized Densification of the Filled Oxide for Quarter Micron Shallow Trench Isolation (STI)," *1996 Symposium on VLSI Technology Digest of Technical Papers*, pp. 158–159 (1996).

Lee et al., "Low Temperature Silicon Nitride and Silicon Dioxide Film Processing by Inductively Coupled Plasma Chemical Vapor Deposition," *Journal of the Electrochemical Society*, vol. 147, No. 4, pp. 1481–1486 (2000).

Lee et al., "A Novel Shallow Trench Isolation Technology Using LPCVD MTO/SiN Liner in SOI Wafer," *Proceedings of the 2001 IEEE International SOI Conference*, pp. 83–84 (2001).

Lien et al., "A Manufacturable Shallow Trench Isolation Process for sub–0.2um DRAM Technologies," *Proceedings of the IEEE/SEMI Advanced Semiconductor Manufacturing Conference and Workshop*, pp. 11–16 (2002).

Lim et al., "The Effects of STI Process Parameters on the Integrity of Dual Gate Oxides," *Proceedings of the 39th Annual International Reliability Physics Symposium*, pp. 48–51 (2001).

Loboda et al., "Chemical influence of inert gas on the thin film stress in plasma–enhanced chemical vapor deposited a–SiN : H films," *Journal of Materials Research*, vol. 11, No. 2, pp. 391–398 (1996).

Luoh et al., "Stress Release for Shallow Trench Isolation by Single–Wafer, Rapid–Thermal Steam Oxidation," *Proceedings of the 10th IEEE International Conference on Advanced Thermal Processing of Semiconductors (RTP 2002)*, pp. 111–118 (2002).

Miyamoto et al., "Impact of Reducing STI–Induced Stress on Layout Dependence of MOSFET Characteristics," *IEEE Transactions on Electron Devices*, vol. 51, No. 3, pp. 440–443 (2004).

Miyano et al., "Facet–Free Si Selective Epitaxial Growth Adaptable to Elevated Source/Drain MOSFETs with Narrow Shallow Trench Isolation," *Japanese Journal of Applied Physics*, vol. 38, pp. 2419–2423 (1999).

Nandakumar et al., "Shallow Trench Isolation for advanced ULSI CMOS Technologies," *IEEE International Electron Devices Meeting Tecnical Digest*, pp. 133–136 (1998).

Nouri et al., "A Manufacturable Shallow Trench Isolation process for 0.18um and beyond—optimization, stress reduction and electrical performance," *Proceedings of the IEEE/SEMI Advanced Semiconductor Manufacturing Conference and Workshop*, pp. 413–418 (1998).

Ootsuka et al., "A Highly Dense, High–Performance 130nm node CMOS Technology for Large Scale System–on–a–Chip Applications," *IEEE International Electron Devices Meeting Technical Digest*, pp. 575–578 (2000).

Ota et al., "Novel Locally Strained Channel Technique for High Performance 55nm CMOS," *IEEE International Electron Devices Meeting Technical Digest*, pp. 27–30 (2002).

Park et al., "Stress Minimization in Deep Sub–Micron Full CMOS Devices by Using an Optimized Combination of the Trench Filling CVD Oxides," *IEEE International Electron Devices Meeting Technical Digest*, pp.. 669–672 (1997).

Park et al., "Correlation between Gate Oxide Reliability and the Profile of the Trench Top Corner in Shallow Trench Isolation (STI)," *IEEE International Electron Devices Meeting Technical Digest*, pp. 747–750 (1996).

Pyi et al., "Roles of Sidewall Oxidation in the Devices with Shallow Trench Isolation," *IEEE Electron Device Letters*, vol. 20, No. 8, pp. 384–386 (1999).

Saino et al., "Control of Trench Sidewall Stress in Bias ECR–CVD Oxide–Filled STI for Enhanced DRAM Data Retention Time," *IEEE International Electron Devices Meeting Technical Digest*, pp. 149–152 (1998).

Scott et al., "NMOS Drive Current Reduction Caused by Transistor Layout and Trench Isolation Induced Stress," *IEEE International Electron Devices Meeting Technical Digest*, pp. 827–830 (1999).

Sekimoto et al., "Silicon nitride single–layer x–ray mask," *Journal of Vacuum Science and Technology*, vol. 21, No. 4, pp. 1017–1021 (1982).

Sheu et al., "Impact of STI Mechanical Stress in Highly Scaled MOSFETs," *Proceedings of the 2003 International Symposium on VLSI Technology, Systems, and Applications*, pp. 76–79 (2003).

Sheu et al., "Study on STI Mechanical Stress Induced Variations on Advanced CMOSFETs," *Proceedings of the IEEE International Conference on Microelectronic Test Structures*, pp. 205–208 (2003).

Shimizu et al., "Local Mechanical–Stress Control (LMC): A New Technique for CMOS–Performance Enhancement," *IEEE International Electron Devices Meeting Technical Digest*, pp. 433–436 (2001).

Shiozawa et al., "Impact of STI Stress on the Junction Characteristics," *Extended Abstracts of the International Workshop on Junction Technology (IWJT)*, pp. 19–20 (2001).

Sleight et al., "Stress Induced Defects and Transistor Leakage for Shallow Trench Isolate SOI," *IEEE Electron Device Letters*, vol. 20, No. 5, pp. 248–250 (1999).

Smeys, et al., "The influence of oxidation–induced stress on the generation current and its impact on scaled device performance," *IEEE International Electron Devices Meeting Technical Digest*, pp. 709–712 (1996).

Steegen et al., "Silicide and Shallow Trench Isolation line width dependent stress induced junction leakage," *2000 Symposium on VLSI Technology Digest of Technical Papers*, pp. 180–181 (2000).

Stiffler et al., "Oxidation–Induced Defect Generation in Advanced DRAM Structures," *IEEE Transactions on Electron Devices*, vol. 37, No. 5, pp. 1253–1258 (1990).

Su et al., "A Scaleable Model for STI Mechanical Stress Effect on Layout Dependence of MOS Electrical Characteristics," *Proceedings of the IEEE 2003 Custom Integrated Circuits Conference*, pp. 245–248 (2003).

Tiwari et al., "Hole Mobility Improvement in Silicon–on–Insulator and Bulk Silicon Transistors Using Local Strain," *IEEE International Electron Devices Meeting Technical Digest*, pp. 939–941 (1997).

Violette et al., "Facet–Free Selective Silicon Epitaxy by Reduced–Pressure Chemical Vapor Deposition," *Journal of The Electrochemical Society*, pp. 1895–1902 (1999).

Yota et al., "A comparative study on inductively–coupled plasma high–density plasma, plasma–enhanced, and low pressure chemical vapor deposition silicon nitride films," *Journal of Vacuum Science and Technology of America*, vol. 18, No. 2, pp. 372–376 (2000).

uz Zaman et al., "Low Cost and Room Temperature Plasma CVD Silicon Nitride Passivation," *Proceedings of the 46th Electronic Components and Technology Conference*, pp. 849–854 (1996).

Wolf et al., *Silicon Processing for the VLSI Era*, Lattice Press, vol. 1, pp. 182–183 and 194 (1986).

International Search Report for International Patent Application No. PCT/US2004/006844, dated Oct. 26, 2004, 4 pages.

Gannavaram, et al., "Low Temperature ($\leq 800°C$) Recessed Junction Selective Silicon–Germanium Source/Drain Technology for sub–70 nm CMOS," *IEEE International Electron Device Meeting Technical Digest*, (2000), pp. 437–440.

Ghani et al., "A 90nm High Volume Manufacturing Logic Technology Featuring Novel 45nm Gate Length Strained Silicon CMOS Transistors," *IEEE International Electron Devices Meeting Technical Digest*, (2003), 978–980.

Huang et al., "Isolation Process Dependence of Channel Mobility in Thin–Film SOI Devices," *IEEE Electron Device Letters*, vol. 17, No. 6 (Jun. 1996), pp. 291–293.

Huang et al., "LOCOS–Induced Stress Effects on Thin–Film SOI Devices," *IEEE Transactions on Electron Devices*, vol. 44, No. 4 (Apr. 1997), pp. 646–650.

Huang, et al., "Reduction of Source/Drain Series Resistance and Its Impact on Device Performance for PMOS Transistors with Raised $Si_{1-x}Ge_x$ Source/Drain", *IEEE Electron Device Letters*, vol. 21, No. 9, (Sep. 2000) pp. 448–450.

Lochtefeld et al., "Investigating the Relationship Between Electron Mobility and Velocity in Deeply Scaled NMOS via Mechanical Stress," *IEEE Electron Device Letters*, vol. 22, No. 12 (2001), pp. 591–593.

Öztürk, et al., "Advanced $Si_{1-x}Ge_x$ Source/Drain and Contact Technologies for Sub–70 nm CMOS," *IEEE International Electron Device Meeting Technical Digest*, (2002), pp. 375–378.

Öztürk, et al., "Low Resistivity Nickel Germanosilicide Contacts to Ultra–Shallow $Si_{1-x}Ge_x$ Source/Drain Junctions for Nanoscale CMOS," *IEEE International Electron Device Meeting Technical Digest* (2003), pp. 497–500.

Öztürk, et al., "Selective Silicon–Gremanium Source/Drain Technology for Nanoscale CMOS," *Mat. Res. Soc. Symp. Proc.*, vol. 717, (2002), pp. C4.1.1–C4.1.12.

Öztürk, et al., "Ultra–Shallow Source/Drain Junctions for Nanoscale CMOS Using Selective Silicon–Germanium Technology," *Extended Abstracts of International Workshop on Junction Technology*, (2001), pp. 77–82.

Thompson et al., "A Logic Nanotechnology Featuring Strained–Silicon," *IEEE Electron Device Letters*, vol. 25, No. 4 (Apr. 2004), pp. 191–193.

Thompson et al., "A 90 nm Logic Technology Featuring 50nm Strained–Silicon Channel Transistors, 7 layers of Cu Interconnects, Low k ILD, and 1um$^2$ SRAM Cell," *IEEE International Electron Devices Meeting Technical Digest*, (2002), pp. 61–64.

Uchino, et al., "A Raised Source/Drain Technology Using In–situ P–doped SiGe and B–doped Si for 0.1μm CMOS ULSIs," *IEEE International Electron Device Meeting Technical Digest*, (1997), pp. 479–482.

\* cited by examiner

SHALLOW TRENCH ISOLATION PROCESS

RELATED APPLICATION

This application claims the benefit of U.S. Provisional Application 60/452,794 filed Mar. 7, 2003, the entire disclosure of which is hereby incorporated by reference.

FIELD OF THE INVENTION

This invention relates generally to semiconductor structures and particularly to shallow trench isolation.

BACKGROUND

The formation of integrated circuits includes the definition of isolation regions to prevent parasitic current leakage between devices. Isolation techniques include the shallow trench isolation (STI) scheme that has increased the planarity and packing density of silicon very large scale integration (Si VLSI) devices, and has thus been the isolation scheme of choice since approximately the 0.25 micrometer ($\mu$m) technology node.

In a typical STI process, an active device area is protected by a pad oxide and a nitride overlayer, and isolation trenches are etched around the active device area. After the trench etch, a liner oxide is formed in each trench. This liner oxidation step serves several purposes. First, the oxidation eliminates any etch damage to a trench sidewall by consuming a small amount of the sidewall material. Second, the liner oxidation rounds the upper corners of the trench, minimizing the fringing fields that can result from sharp corners at the active area edge. If present, these fields form a parasitic, low-threshold voltage transistor at the active area edge that can degrade the subthreshold characteristics of the main device. Finally, because it is typically a thermal oxide, the liner oxide forms a high-quality interface between the Si trench sidewall and the deposited trench oxide. Interface traps, i.e., electrically active defects present at an oxide/semiconductor interface, are thereby minimized at this interface. The liner oxidation is often performed at high temperatures, i.e., >1000° C., and in an oxygen, i.e., dry ambient.

After the liner oxidation, a chemical vapor deposited (CVD) dielectric, such as silicon dioxide, is deposited over the entire substrate, filling the trenches. This CVD dielectric also covers the active device regions, and it should be selectively removed for device processing to continue. This is accomplished by planarizing the substrate, typically via chemical-mechanical polishing (CMP), using the silicon nitride layer over the active area as a stop layer. This process removes the dielectric from the active areas while retaining it in the isolation trenches. The nitride and pad oxide masking layers are then removed, resulting in a highly planar substrate with isolated device regions.

The formation of STI structures on silicon-germanium (SiGe) virtual substrates may be particularly challenging. SiGe virtual substrates are a platform for new generations of VLSI devices that exhibit enhanced performance in comparison to devices fabricated on bulk Si substrates. An important component of a SiGe virtual substrate is a layer of SiGe that has been relaxed to its equilibrium lattice constant, i.e., a lattice constant that is larger than that of Si. This relaxed SiGe layer may be formed directly on a Si substrate by, e.g., wafer bonding or direct epitaxy, or atop a relaxed graded SiGe layer, in which the lattice constant of the SiGe material has been increased gradually over the thickness of the layer. The SiGe virtual substrate can also incorporate buried insulating layers, echoing the structure of a semiconductor-on-insulator (SOI) wafer. In order to fabricate high-performance devices on these platforms, thin strained layers of Si, Ge, or SiGe are grown on the relaxed SiGe virtual substrates. The resulting biaxial tensile or compressive strain alters the carrier mobilities in the layers, enabling the fabrication of high speed and/or low power devices. Many issues and challenges arise when fabricating devices on SiGe rather than bulk Si substrates.

Forming an STI structure on a SiGe virtual substrate includes the etching and exposure of the underlying relaxed SiGe. Direct thermal liner oxidation of a trench etched in SiGe may be problematic and may result in a low-quality liner oxide. During liner oxidation, the Ge in the SiGe may be snowplowed ahead of an oxidation front, resulting in a pure silicon dioxide ($SiO_2$) oxide layer atop a portion of a SiGe layer that is enriched in Ge content in comparison to the SiGe bulk material. Although in this case, the oxide itself has all of the properties of oxidized Si, it is proximate a layer of SiGe with an elevated Ge content. The presence of this elevated level of Ge at this interface may result in a very high density of interface traps. These interface traps may in turn result in increased subthreshold leakage, or in a shift in threshold voltage, for the active device, and are therefore undesirable.

If a trench is relied upon to induce all of the strain in a channel, the amount of strain that can be induced in the channel is limited. Too much trench-induced strain may produce defects, leading to problems with device operation.

SUMMARY

Trench structures, as well as other strain-inducing elements, are provided to induce strain in channel regions of transistors. This strain improves the performance of transistors, particularly those fabricated with small active area dimensions.

In accordance with an aspect of the present invention, interface trap density at an interface between a liner dielectric, such as an oxide, and a trench sidewall is decreased, i.e., at the point where the trench is defined in a SiGe virtual substrate. After the trench etch process is completed, a liner dielectric is formed. For example, a liner oxidation is performed such that the Ge present in the SiGe is not snowplowed ahead of the oxidation front. Instead, the Ge is incorporated into the liner oxide, leading to a decreased interface trap density and reduced subthreshold device leakage. The liner oxidation may take place in a wet, i.e., steam ambient and/or at a low temperature, i.e., <1000° C.

Since the liner oxide contains Ge incorporated during the oxidation process, it may be more susceptible to attack by etchants used during subsequent processing, e.g., wet cleans such as hydrofluoric acid (HF) or even rinses in deionized water. To protect the liner oxide from accelerated etching, a secondary protective liner may be used. This liner, preferably a dielectric material such as silicon nitride or silicon dioxide, may be deposited conformally over the initial liner oxide. The protective liner is selected to have a lower etch rate in wet etchants, such as HF, than the liner oxide. Since it may not contain Ge and may thus be less susceptible to etchants, this protective liner may preserve the integrity of the liner oxide during subsequent process steps. After the formation of the protective liner, the STI process is then continued as for Si substrates i.e., the trench is filled with a dielectric material such as high density plasma oxide.

In accordance with this invention, the interface between the liner dielectric and the trench sidewalls has a satisfactory integrity with a low interface trap density, e.g., less than $5 \times 10^{11}/cm^2$. Additionally, transistor off-state current ($I_{off}$) is affected by the edge-leakage that occurs underneath the gate of the transistor. A low interface trap density in the portions of the STI disposed underneath the gate, therefore, is critical for obtaining a low $I_{off}$. If the interface trap density is low, as enabled by this invention, sufficient leakage current cannot flow under the transistor gate to induce a high $I_{off}$. In a transistor having a channel width of 1 μm, the $I_{off}$ may be less than $10^{-6}$ Ampere. In some embodiments, the off current may be less than $10^{-9}$ Ampere. This low device off current is achieved utilizing a novel STI process that has a large degree of process latitude. In some embodiments, because the Ge-containing liner oxide is protected by a protective liner, additional process steps will be similar to those employed in standard processes. The liner oxide's possible susceptibility to chemical attack will not place limits on subsequent process steps.

In an aspect of the invention, a masking material may be used during the formation of an STI structure, i.e., a trench structure, to induce a strain of a type different from a strain in a strained layer in which the trench structure is being defined.

In an aspect, the invention features a structure including a substrate, and a first transistor disposed over a first region of the substrate. The first transistor includes a first source region and a first drain region disposed in a first portion of the substrate, a first channel region disposed between the first source region and the first drain region, the first channel region having a first type of strain, and a first gate disposed above the first channel region and between the first source and first drain regions, the first gate including a material selected from the group of a doped semiconductor, a metal, and a metallic compound. A first trench structure is proximate at least one side of one of the first source region and the first drain region. The first trench structure induces only a portion of the first type of strain in the first channel region.

One or more of the following features may be included. A strained layer may be disposed over the substrate. The strained layer may include at least one of silicon and germanium. At least a portion of the first channel region may be disposed in the strained layer. A dielectric layer may be disposed over the substrate, and the strained layer may be disposed over and in contact with the dielectric layer. The first type of strain may be tensile. The first type of strain may be compressive. The substrate may include at least one of silicon and germanium. The substrate comprises at least one element other than silicon. The other element may be germanium.

A first cap layer may be disposed over a surface of the first transistor, and the strain in the first channel region may be induced by the first cap layer. The first cap layer may include silicon nitride. The strain in the first channel region may be induced by at least one of the first source region and the first drain region. The at least one of the first source region and the first drain region may include a second material having a larger lattice constant than a lattice constant of a semiconductor material disposed in at least one of the first channel region and an area proximate at least one of the first source region and the first drain region. The second material may include a material selected from the group including SiGe and Ge. The at least one of the first source region and the first drain region may include a second material having a smaller lattice constant than a lattice constant of a semiconductor material disposed in at least one of the first channel region and an area proximate at least one of the first source region and the first drain region. The second material may include a material selected from the group of SiGe, Si, and SiC.

The strain in the first channel region is induced by the first gate. The first gate may include material selected from the group of metal silicide, metal germanosilicide, and metal germanocide.

The structure may include a second transistor disposed over a second region of the substrate. The second transistor may include a second source region and a second drain region disposed in a second portion of the substrate, a second channel region disposed between the second source region and the second drain region, the second channel region having a second type of strain, and a second gate disposed above the second channel region and between the second source and second drain regions, the second gate including a material selected from the group of a doped semiconductor, a metal, and a metallic compound; and a second trench structure proximate at least one side of one of the second source region and the second drain region, the second trench structure inducing only a portion of the second type of strain in the second channel region. The first and second types of strain may be different.

The portion of the strain induced by the first trench structure may be approximately zero. The structure may include a first strain-inducing element, and a first epitaxial strained layer. The first channel region may be disposed within a portion of the first epitaxial strained layer and the first strain-inducing element may induce only a portion of the strain in the first channel region. The first strain-inducing element may include a first cap layer disposed over a surface of the first transistor. The first strain-inducing element may include the first gate. The first strain-inducing element may include at least one of the first source region and the first drain region.

In another aspect, the invention features a method for forming a semiconductor structure, the method including providing a substrate and forming a first transistor over a first region of the substrate. The first transistor may be formed by defining a first source region and a first drain region in a first portion of the substrate, defining a first channel region between the first source region and the first drain region, the first channel region having a first type of strain, and forming a first gate above the first channel region and between the first source and first drain regions, the first gate including a material selected from the group of a doped semiconductor, a metal, and a metallic compound. A trench structure may be formed proximate at least one side of one of the first source region and the first drain region, the first trench structure tailored to induce only a portion of the first type of strain in the first channel region.

One or more of the following features may be included. A second transistor may be formed over a second region of the substrate. The second transistor may be formed by defining a second source region and a second drain region in a second portion of the substrate, defining a second channel region between the second source region and the second drain region, the second channel region having a second type of strain, and forming a second gate above the second channel region and between the second source and second drain regions, the second gate including a material selected from the group of a doped semiconductor, a metal, and a metallic compound. A second trench structure is formed proximate at least one side of one of the second source region and the second drain region, the second trench structure tailored to induce only a portion of the second type of strain in the second channel region.

The first and second types of strain may be different. A first cap layer may be formed over a surface of the first transistor, the cap layer tailored to induce the first type of strain in the first channel region. At least a portion of the strain in the first channel region may be induced by at least one of the first source region and the first drain region. At least one of the first source region and the first drain region may include a second material having a larger lattice constant than a lattice constant of a semiconductor material disposed in at least one of the first channel region and an area proximate at least one of the first source region and the first drain region.

The at least one of the first source region and the first drain region may include a second material having a smaller lattice constant than a lattice constant of a semiconductor material disposed in at least one of the first channel region and an area proximate at least one of the first source region and the first drain region.

At least a portion of the strain in the first channel region may be induced by the first gate. The portion of the first type of strain the first trench structure is tailored to induce may be approximately zero. The first channel region may be defined in a portion of a first epitaxial strained layer.

A first strain-inducing element may be provided. The first strain-inducing element may include a first cap layer disposed over a surface of the first transistor. The first strain-inducing element may include the first gate. The first strain-inducing element may include at least one of the first source region and the first drain region.

BRIEF DESCRIPTION OF DRAWINGS

FIGS. 10a–10e are schematic plan and cross-sectional views, of a device including the semiconductor structure illustrated in FIG. 9, with FIG. 10b being taken along the line 10b—10b in FIG. 10a; FIG. 10c being taken along the line 10c—10c in FIG. 10a; and FIGS. 10d–10e illustrating the semiconductor structure of FIG. 10c after alternative processing steps.

Like-referenced features represent common features in corresponding drawings.

DETAILED DESCRIPTION

Figure 1A:
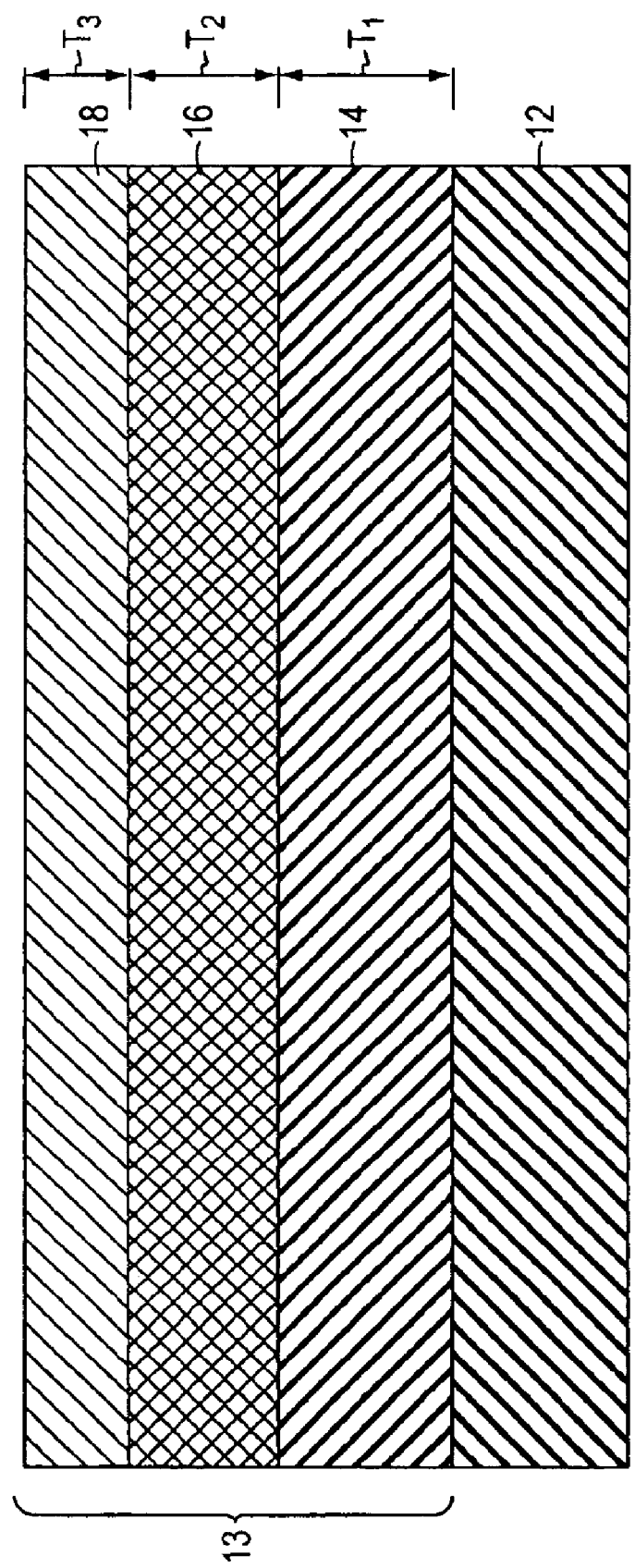
FIGS. 1–9 are a series of schematic cross-sectional views of a semiconductor structure illustrating a process for fabricating the structure.

In FIG. 1a, which illustrates a structure amenable to use in connection with the present invention, a substrate 12 is made of a semiconductor, such as Si, Ge, or SiGe. A plurality of layers collectively indicated as 13 are formed on substrate 12. The plurality of layers 13 may include a relaxed graded buffer layer 14 disposed over substrate 12. Graded layer 14 includes, for example, SiGe having a grading rate of, for example, 10% Ge per $\mu$m of thickness, and a thickness $T_1$ of, for example, 1–9 $\mu$m.

A relaxed layer 16 is disposed over graded SiGe layer 14. Relaxed layer 16 contains, for example, $Si_{1-x}Ge_x$ wherein $0.1 \leq x \leq 0.9$ and has a thickness $T_2$ of, e.g., 0.2–2 $\mu$m. In some embodiments, $Si_{1-x}Ge_x$ may include $Si_{0.70}Ge_{0.30}$ and $T_2$ may be approximately 1.5 $\mu$m. Relaxed layer 16 may be substantially or fully relaxed, as determined by triple axis X-ray diffraction, and may have a threading dislocation density of <1×10$^6$ dislocations/cm$^2$, as determined by etch pit density (EPD) analysis. Because threading dislocations are linear defects disposed within a volume of crystalline material, threading dislocation density may be measured as either the number of dislocations intersecting a unit area within a unit volume or the line length of dislocation per unit volume. Threading dislocation density therefore, may be expressed in either units of dislocations/cm$^2$ or cm/cm$^3$. Relaxed layer 16 may have a surface particle density of, e.g., less than about 0.3 particles/cm$^2$. Further, relaxed layer 16 may have a localized light-scattering defect level of less than about 0.3 defects/cm$^2$ for particle defects having a size (diameter) greater than 0.13 $\mu$m, a defect level of about 0.2 defects/cm$^2$ for particle defects having a size greater than 0.16 $\mu$m, a defect level of about 0.1 defects/cm$^2$ for particle defects having a size greater than 0.2 $\mu$m, and a defect level of about 0.03 defects/cm$^2$ for defects having a size greater than 1 $\mu$m. Process optimization may enable reduction of the localized light-scattering defect levels to about 0.09 defects/cm$^2$ for particle defects having a size greater than 0.09 $\mu$m and to 0.05 defects/cm$^2$ for particle defects having a size greater than 0.12 $\mu$m.

Substrate 12, graded layer 14, and relaxed layer 16 may be formed from various material systems, including various combinations of group II, group III, group IV, group V, and group VI elements. For example, each of substrate 12, graded layer 14, and relaxed layer 16 may include a III-V compound. Substrate 12 may include gallium arsenide (GaAs), graded layer 14 and relaxed layer 16 may include indium gallium arsenide (InGaAs) or aluminum gallium arsenide (AlGaAs). These examples are merely illustrative, and many other material systems are suitable.

A strained semiconductor layer 18 is disposed over relaxed layer 16. Strained layer 18 may include a semiconductor such as at least one of a group II, a group III, a group IV, a group V, and a group VI element. Strained semiconductor layer 18 may include, for example, Si, Ge, SiGe, GaAs, indium phosphide (InP), and/or zinc selenide (ZnSe). Strained layer 18 may have a starting thickness $T_3$ of, for example, 50–1000 angstroms (Å). In an embodiment, $T_3$ may be approximately 200–500 Å.

Strained layer 18 may be formed by epitaxy, such as by atmospheric-pressure CVD (APCVD), low- (or reduced-) pressure CVD (LPCVD), ultra-high-vacuum CVD (UHVCVD), by molecular beam epitaxy (MBE), or by atomic layer deposition (ALD). Strained layer 18 containing Si may be formed by CVD with precursors such as dichlorosilane, silane, disilane, or trisilane. Strained layer 18 containing Ge may be formed by CVD with precursors such as germane or digermane. The epitaxial growth system may be a single-wafer or multiple-wafer batch reactor. The growth system may also utilize a low-energy plasma to enhance layer growth kinetics.

In an embodiment in which strained layer 18 contains substantially 100% Si, strained layer 18 may be formed in a dedicated chamber of a deposition tool that is not exposed to Ge source gases, thereby avoiding cross-contamination and improving the quality of the interface between strained layer 18 and relaxed layer 16. Furthermore, strained layer 18 may be formed from an isotopically pure precursor(s). Isotopically pure materials (e.g., Si or Ge) have better thermal conductivity than materials present as mixtures of atomic isotopes. Higher thermal conductivity may help dissipate heat from devices subsequently formed on strained layer 18, thereby maintaining the enhanced carrier mobilities provided by strained layer 18.

After formation, strained layer 18 has an initial misfit dislocation density of, for example, 0–10$^5$ cm/cm$^2$. In an embodiment, strained layer 18 has an initial misfit dislocation density of approximately 0 cm/cm$^2$. Because misfit dislocations are linear defects generally lying within a plane between two crystals within an area, they may be measured in terms of total line length per unit area. Misfit dislocation density, therefore, may be expressed in units of dislocations/cm or cm/cm$^2$. In one embodiment, strained layer 18 may be tensilely strained, e.g., Si formed over SiGe. In another embodiment, strained layer 18 may be compressively strained, e.g., Ge formed over SiGe.

Strained layer 18 may have a surface particle density of, e.g., less than about 0.3 particles/cm$^2$. As used herein, "surface particle density" includes not only surface particles but also light-scattering defects, and crystal-originated pits (COPs), and other defects incorporated into strained layer 18. Process optimization may enable reduction of the localized light-scattering defect levels to about 0.09 defects/cm$^2$ for particle defects having a size greater than 0.09 $\mu$m and to 0.05 defects/cm$^2$ for particle defects having a size greater than 0.12 $\mu$m. These surface particles may be incorporated in strained layer 18 during the formation of strained layer 18, or they may result from the propagation of surface defects from an underlying layer, such as relaxed layer 16.

In alternative embodiments, graded layer 14 may be absent from the structure. Relaxed layer 16 may be formed in various ways, and the invention is not limited to embodiments having graded layer 14. In other embodiments, strained layer 18 may be formed directly on substrate 12. In this case, the strain in layer 18 may be induced by lattice mismatch between layer 18 and substrate 12, induced mechanically, e.g., by the deposition of overlayers, such as Si$_3$N$_4$, or induced by thermal or lattice mismatch between layer 18 and a subsequently grown layer, such as a SiGe layer. In some embodiments, a uniform semiconductor layer (not shown), having a thickness of approximately 0.01–1.5 $\mu$m and comprising the same semiconductor material as substrate 12, is disposed between graded buffer layer 14 and substrate 12. This uniform semiconductor layer may be grown to improve the material quality of layers subsequently grown on substrate 12, such as graded buffer layer 14, by providing a clean, contaminant-free surface for epitaxial growth. In certain embodiments, relaxed layer 16 may be planarized prior to growth of strained layer 18 to eliminate the crosshatched surface roughness induced by graded buffer layer 14. (See, e.g., M. T. Currie, et al., *Appl. Phys. Lett.*, 72 (14) p. 1718 (1998), incorporated herein by reference.) The planarization may be performed by a method such as CMP, and may improve the quality of a subsequent bonding process because it minimizes the wafer surface roughness and increases wafer flatness, thus providing a greater surface area for bonding.

Figure 1B:
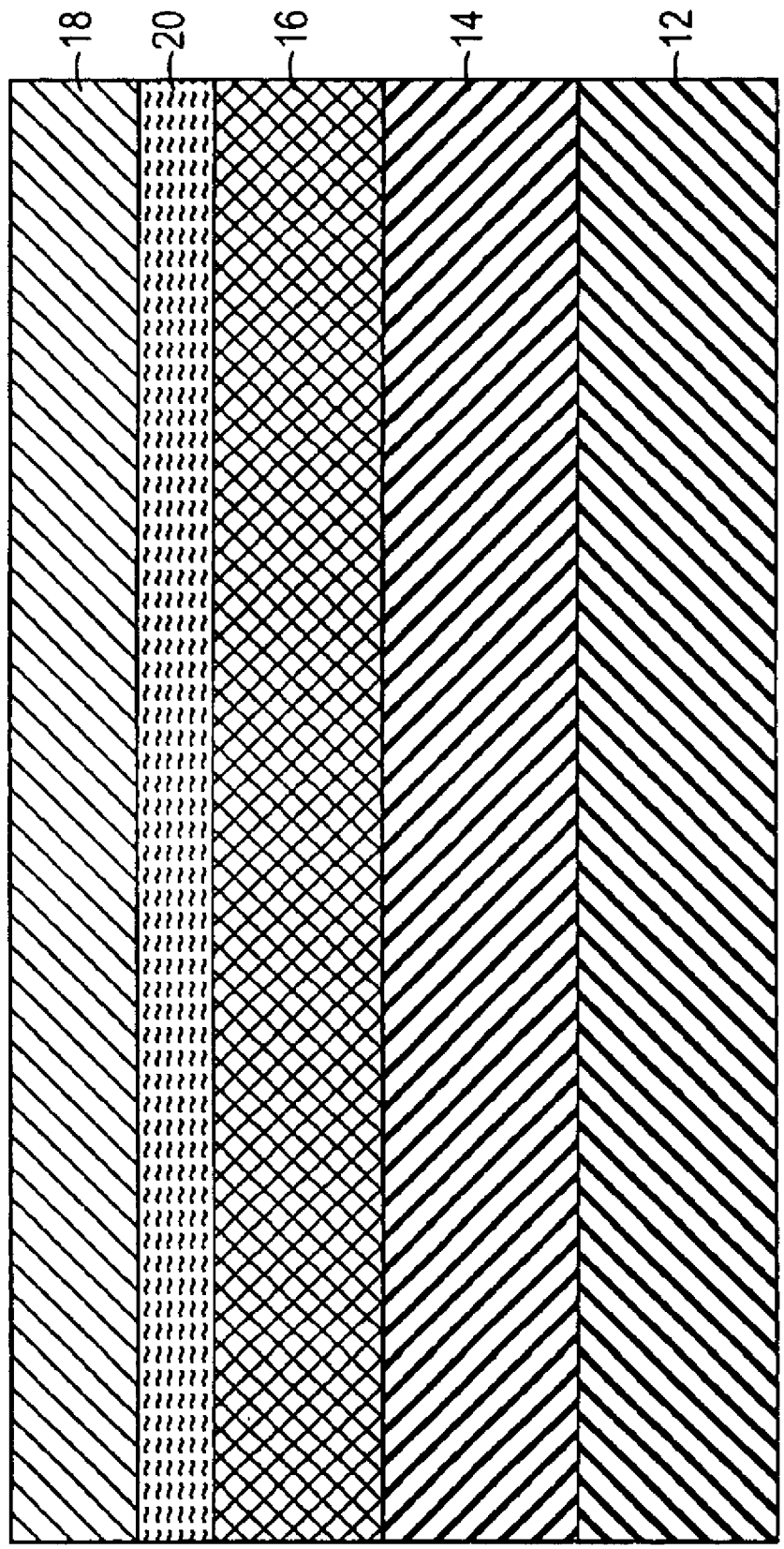

Referring to FIG. 1b, after planarization of relaxed layer 16, a relaxed semiconductor regrowth layer 20 including a semiconductor such as SiGe may be grown on relaxed layer 16, thus improving the quality of subsequent strained layer 18 growth by ensuring a clean surface for the growth of strained layer 18. Growing on this clean surface may be preferable to growing strained material, e.g., silicon, on a surface that is possibly contaminated by oxygen and carbon from the planarization process. The conditions for epitaxy of the relaxed semiconductor regrowth layer 20 on the planarized relaxed layer 16 may be chosen such that surface roughness of the resulting structure, including layers formed over regrowth layer 20, is minimized to ensure a surface suitable for, in some embodiments, subsequent high quality bonding for forming, e.g., a strained semiconductor-on-insulator (SSOI) structure.

In another embodiment, a compressively strained layer (not shown) may be disposed below or above strained layer 18. In such embodiment, the compressively strained layer includes Si$_{1-y}$Ge$_y$ with a Ge content (y) higher than the Ge content (x) of relaxed Si$_{1-x}$Ge$_x$ layer 16. The compressively strained layer may contain, for example, a Ge content wherein $0.3 \leq y \leq 1$ and have a thickness of, e.g., 10–200 Å.

Figure 1C:
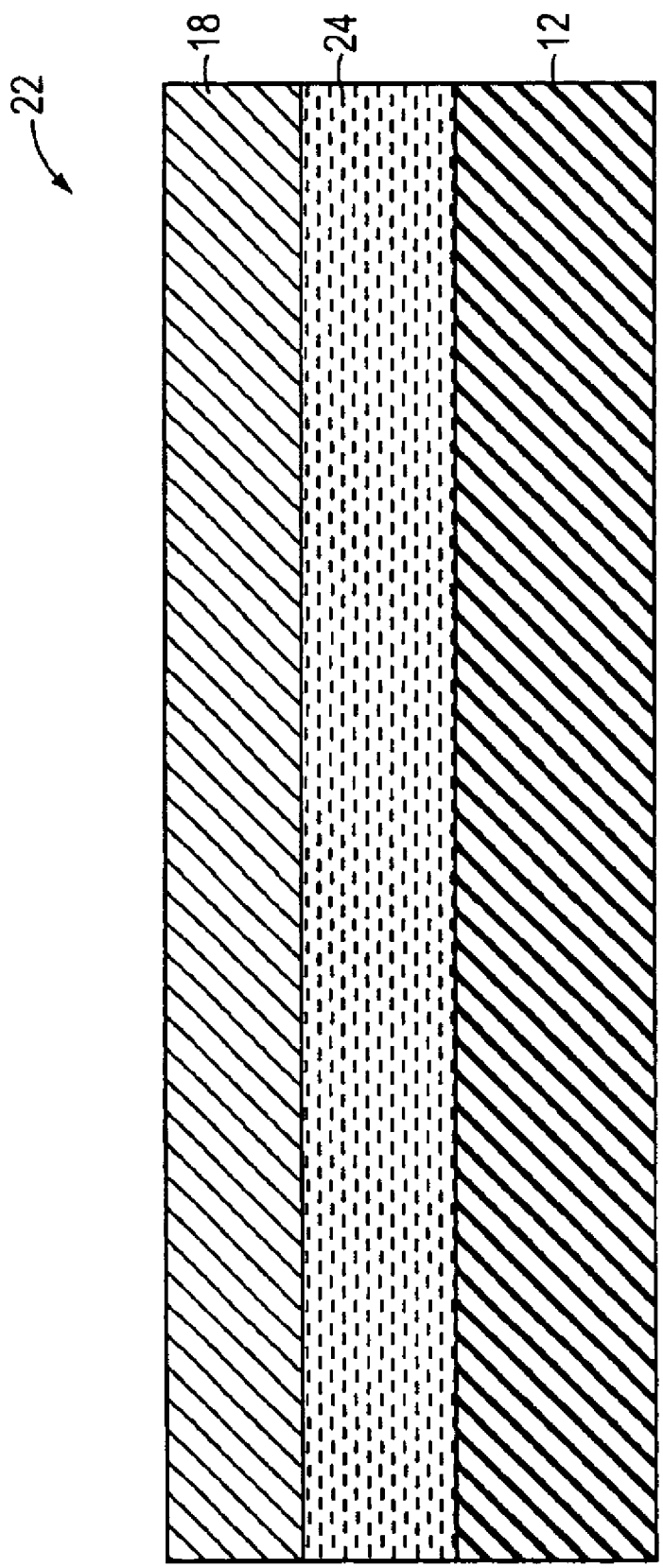

FIG. 1c illustrates another type of structure amenable to use in connection with the present invention. Specifically, the structure is an SSOI substrate 22 having an insulator layer 24 disposed beneath strained layer 18. Insulator layer 24 may be a dielectric layer including an oxide, for example, SiO$_2$. In an embodiment, dielectric layer 24 may include a material having a higher melting point (T$_m$) than that of pure SiO$_2$, i.e., higher than 1700° C. Examples of such materials are silicon nitride (Si$_3$N$_4$), aluminum oxide, magnesium oxide, etc. Using dielectric layer 24 with a high T$_m$ helps prevents possible relaxation of the transferred strained semiconductor layer 18 that may occur during subsequent processing, due to softening of the underlying dielectric layer 24 at temperatures typically used during device fabrication (approximately 1000–1200° C.). In such embodiment where strained layer 18 is formed directly on insulator layer 24, relaxed layer 16 and graded layer 14 may be absent from the structure. In another embodiment (not shown), the insulator layer 24 may be disposed directly beneath relaxed layer 16. In this case, graded layer 14 may be absent from the structure. The insulator layer 24 may have a thickness of, e.g., 200–3000 Å.

Figure 2:
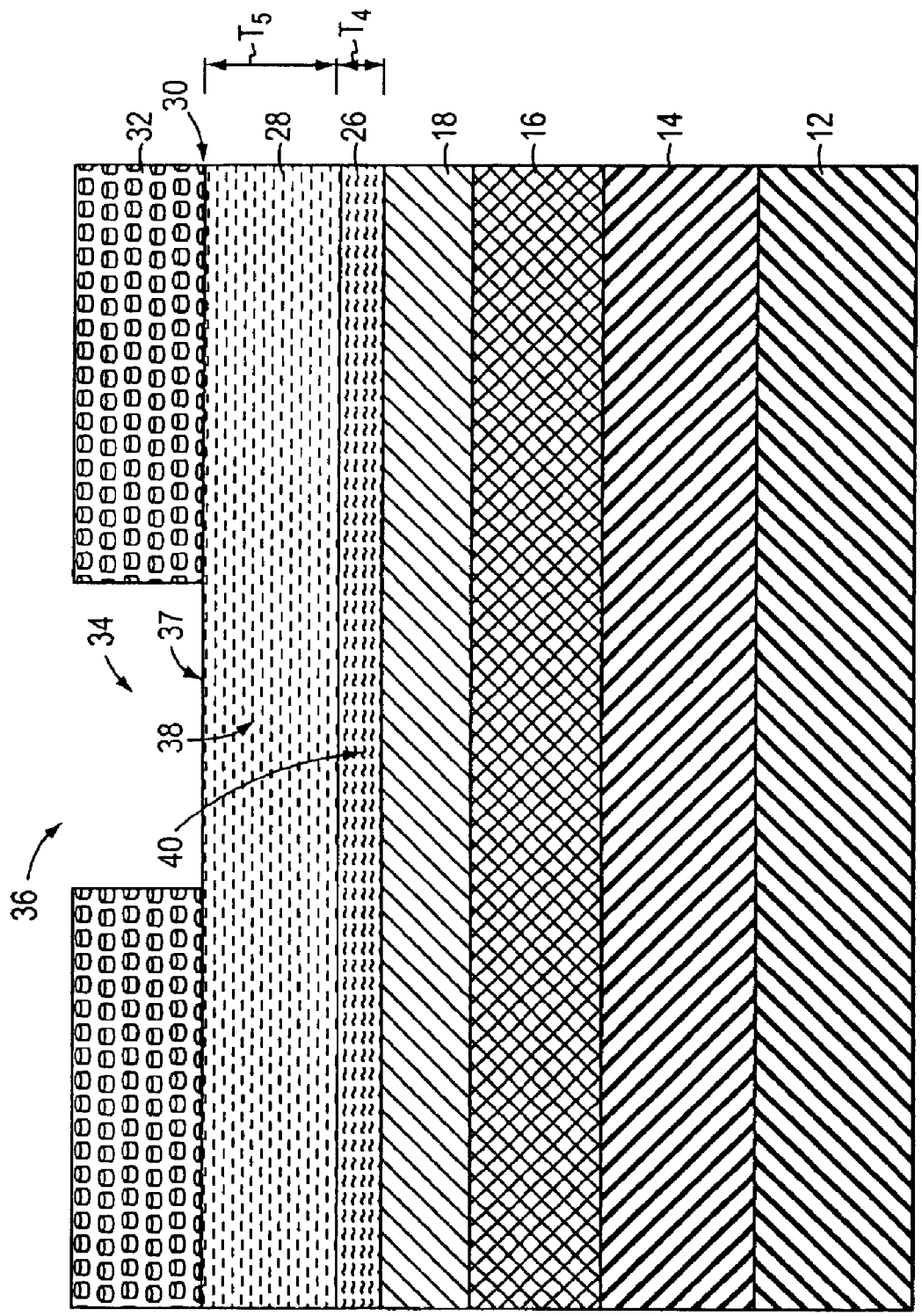

Referring to FIG. 2, a first masking layer 26, such as a pad silicon dioxide layer, hereinafter referred to as pad oxide 26, is formed over strained layer 18 by thermal growth or by a suitable deposition method such as low-pressure chemical vapor deposition (LPCVD). Pad oxide 26 may have a thickness T$_4$ of, e.g., 50–200 Å. Subsequently, a second masking layer 28, such as a masking silicon nitride layer, is deposited over pad oxide 26 by a suitable deposition method such as LPCVD, high density plasma CVD, or plasma-enhanced chemical vapor deposition (PECVD). Masking layer 28 may be a dielectric material, e.g. silicon nitride or silicon oxynitride, and may be etched selectively with respect to underlying pad oxide 26.

Masking layer 28 may include a material selected to exert a type of strain different from the type of strain in strained layer 18. For example, in one embodiment, strained layer 18 may have a first type of strain, e.g., tensile strain, and masking layer 28 may have a second type of strain, e.g., compressive strain. More specifically, strained layer 18 may include tensilely strained silicon and masking layer 28 may include compressively strained silicon nitride. In another embodiment, strained layer 18 may be compressively strained, and masking layer 28 may be tensilely strained. More specifically, strained layer 18 may include compressively strained germanium, and masking layer 28 may include tensilely strained silicon nitride.

Mismatching the types of strain in masking layer 28 and strained layer 18 may help prevent relaxation of strained layer 18 during subsequent high temperature processing steps. In addition, although the thickness of pad oxide 26 may typically be selected to be large enough to buffer the underlying structure from strain exerted by masking layer 28, the thickness of pad oxide 26 may be reduced (e.g., to less than 200 Å, preferably less than 100 Å) to facilitate the exertion of strain by masking layer 28 on underlying layers. Masking layer 28 may have a thickness T$_5$ of, for example, 500–2000 Å.

The strain of silicon nitride films grown by LPCVD at temperatures greater than approximately 700° C. may be selected by varying the silicon content of the nitride film. (See, e.g., S. Habermehl, *J. Appl. Phys.*, 83 (9) p. 4672 (1998), incorporated herein by reference.) For example, LPCVD stoichiometric silicon nitride films (i.e., $Si_3N_4$) are typically tensilely strained, while silicon-rich nitride films (e.g., with a silicon volume fraction greater than 0.1–0.15, or with a Si/N atomic ratio greater than 0.75) are typically compressively strained. The silicon content of a nitride film formed by LPCVD may be varied by changes in the ratio of silicon and nitrogen precursors utilized in the growth process. For example, a nitride growth process performed at 850° C. and a pressure of 200 milliTorr (mTorr) utilizing dichlorosilane ($SiCl_2H_2$) as a silicon precursor and ammonia ($NH_3$) as a nitrogen precursor will form a silicon-rich nitride when the ratio of dichlorosilane flow to the total gas flow is greater than approximately 0.85. For lower temperatures, the relative amount of dichlorosilane may need to be increased to form silicon-rich nitride films. Compressive silicon nitride films may have a refractive index greater than approximately 2.4, and tensile silicon nitride films may have a refractive index smaller than approximately 2.4. (See, e.g., M. Sekimoto, et al., *J. Vac. Sci. Technol.*, 21 (4) p. 1017 (1982), incorporated herein by reference.)

In another embodiment, silicon nitride films for various strain levels may be formed by PECVD at deposition temperatures less than approximately 700° C. Variations in precursor gas ratio, RF power, dilution gas, and plasma excitation frequency may lead to strain variations in the final film. For example, for a PECVD process performed at 220° C., 200 Pascals pressure, 100 watts RF power, and helium dilution, a compressive silicon nitride film may be deposited when the ratio of silane flow to total gas flow (silane, ammonia, and nitrogen) is smaller than approximately 0.03. When this ratio is larger than approximately 0.03, a tensilely strained silicon nitride film may be deposited. (See, e.g., M. J. Loboda, et al., *J. Mater. Res.*, 11 (2) p. 391 (1996), incorporated herein by reference.)

In an alternative embodiment, silicon nitride films of varying strain levels may be produced by high density plasma CVD (HDPCVD) in a process utilizing an inductively coupled plasma (ICP) source at temperatures less than 500° C. with precursors such as silane, ammonia, and nitrogen. The plasma used in this process may utilize noble gases such as argon or helium, which may also act as dilution gases in this process. The chuck power levels may be varied to tailor strain levels in silicon nitride films. For example, a process at 150° C. and 10 mTorr utilizing silane, ammonia, and helium gases (total gas flow of 40 standard cubic centimeters per minute (sccm)) and an ICP power of 800 watts may produce compressively strained silicon nitride films for RF chuck power levels less than approximately 40 watts and tensilely strained silicon nitride films for RF chuck power levels greater than approximately 40 watts. (See, e.g., J. W. Lee, et al., *J. Electrochemical. Soc.*, 147 (4) p. 1481 (2000), incorporated herein by reference.)

Figure 3:
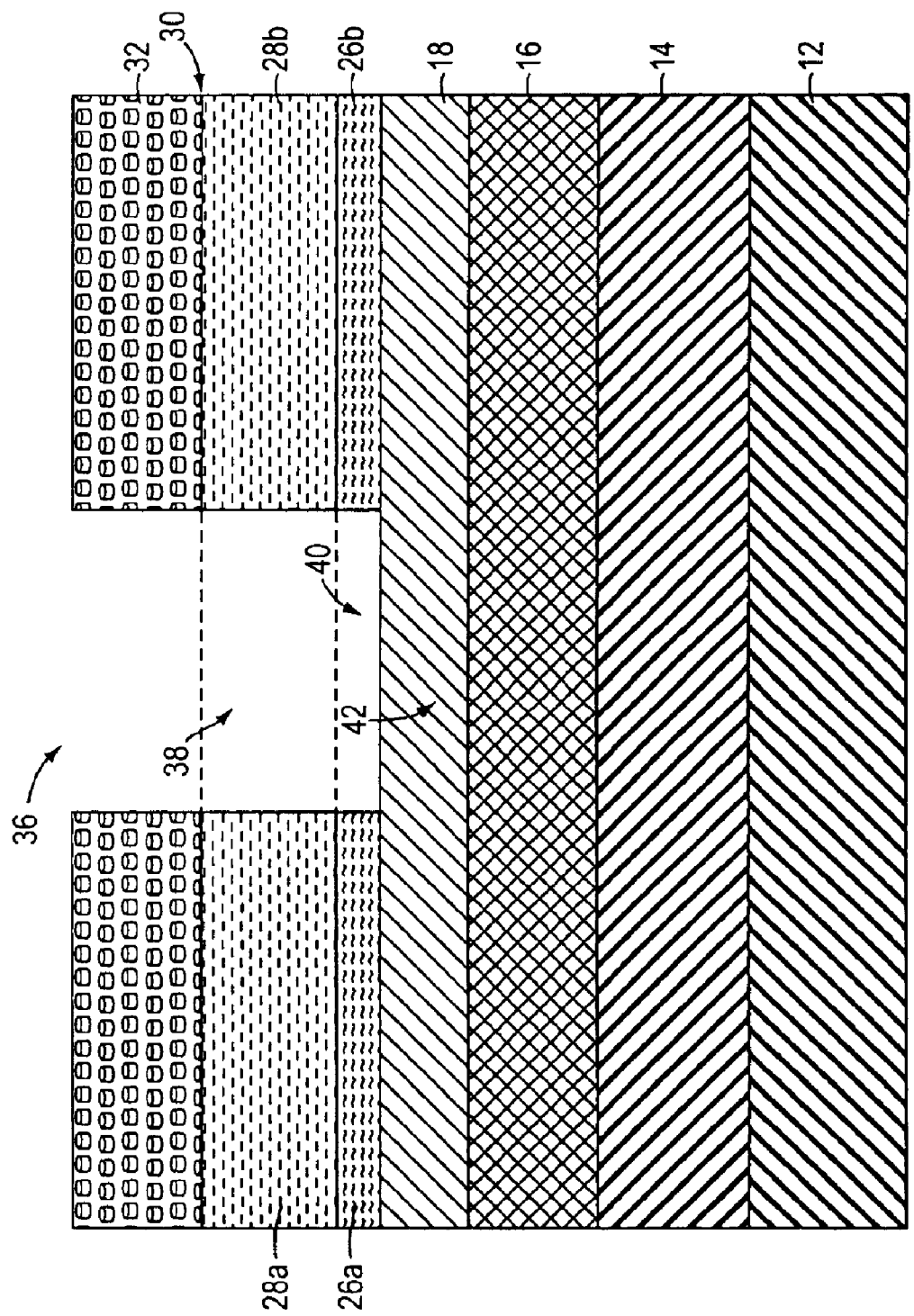

Referring to FIG. 2 and also to FIG. 3, a photoresist layer is deposited over a top surface 30 of masking layer 28 and patterned to form a photoresist mask 32. Photoresist mask 32 defines an opening 34 over a region 36 of substrate 12 and layers 13 in which a trench structure 55 may be formed (see, e.g., trench structure 55 in FIG. 5a). Opening 34 exposes a portion 37 of top surface 30 of masking layer 28 disposed over region 36.

After the definition of photoresist mask 32, a portion 38 of masking layer 28 exposed by photoresist layer 32 is removed, leaving behind masking layer portions 28a, 28b protected by photoresist mask 32 and exposing a portion 40 of pad oxide 26. Portion 40 of pad oxide 26 is then removed, leaving behind pad oxide portions 26a, 26b. In particular, exposed masking layer portion 38 may be removed by a suitable removal process such as a reactive ion etch (RIE) using gases such as a combination of nitrogen trifluoride, ammonia, and oxygen, or a combination of hydrogen bromide, chlorine, and oxygen. Pad oxide portion 40 may be removed by a wet etch that is selective to silicon, such as a hydrofluoric acid etch. The removal of pad oxide portion 40 exposes a portion 42 of strained layer 18. In an alternative embodiment, a first RIE etch may be to performed to remove portion 38 of masking layer 28, as well as portion 40 of pad oxide 26. This first RIE etch may not be selective to underlying semiconductor material, and may etch perhaps a few hundred Å into an underlying semiconductor material, e.g., strained layer 18. Then a second RIE etch step may be performed with a different chemistry and/or etch conditions, to remove ~2500–4000 Å of underlying material, as described below with reference to formation of trench 50.

Figure 4:
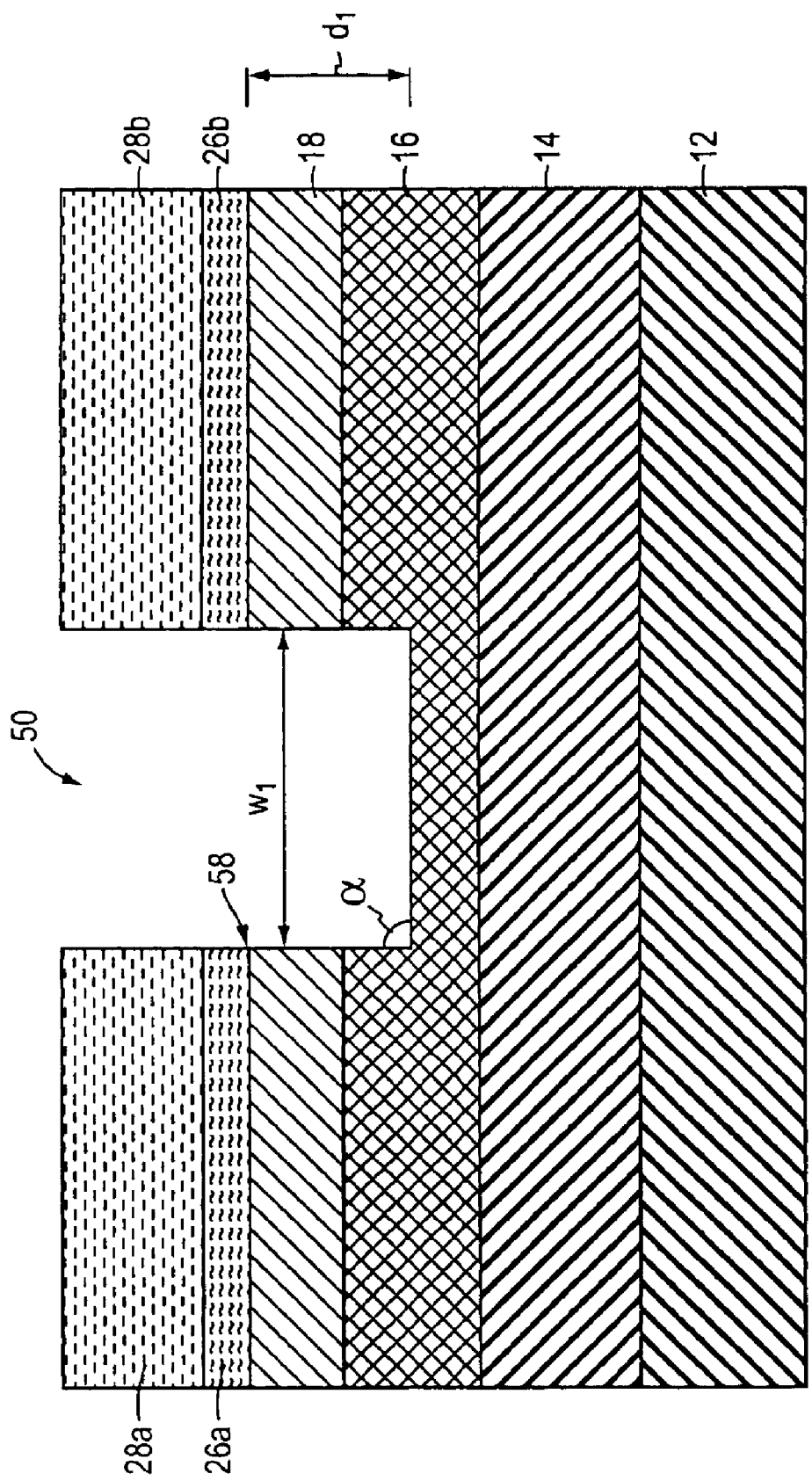

Referring to FIG. 3 and also to FIG. 4, a trench 50 is defined in strained layer 18 and relaxed layer 16. Trench 50 may be formed, for example, by a dry reactive ion etch. A two-step etch process may be used, with the strained layer 18 being etched dining the first step with a gas such as chlorine and/or hydrogen bromide, and the relaxed layer 16 being etched during the second step with a gas such as chlorine and/or hydrogen bromide. The total gas pressure and/or the flow ratio of etch gases may differ between the steps of the two-step etch process. Trench 50 may have a depth $d_1$ within a range of, for example, 3000–4000 Å, and a width $w_1$ of less than depth $d_1$, e.g., $w_1$ maybe approximately 1000 Å. In some embodiments, the width $w_1$ of trench 50 may be larger than its depth $d_1$, with $w_1$ being as large as several micrometers. In some embodiments, depth $d_1$ may be even deeper, e.g., in deep trench isolation processes. A sidewall 58 of trench 50 may be substantially vertical, i.e., forming an angle $\alpha$ of greater than approximately 80° with a plane parallel to a surface of the substrate. The bottom corners of trench 50 may be substantially rounded to facilitate subsequent filling with an isolation material. After the selective removal of portions 38, 40 of masking layer 28 and pad oxide 26 and the formation of trench 50, photoresist mask 32 may be removed by a stripping process such as a dry strip in oxygen plasma.

Figure 5A:
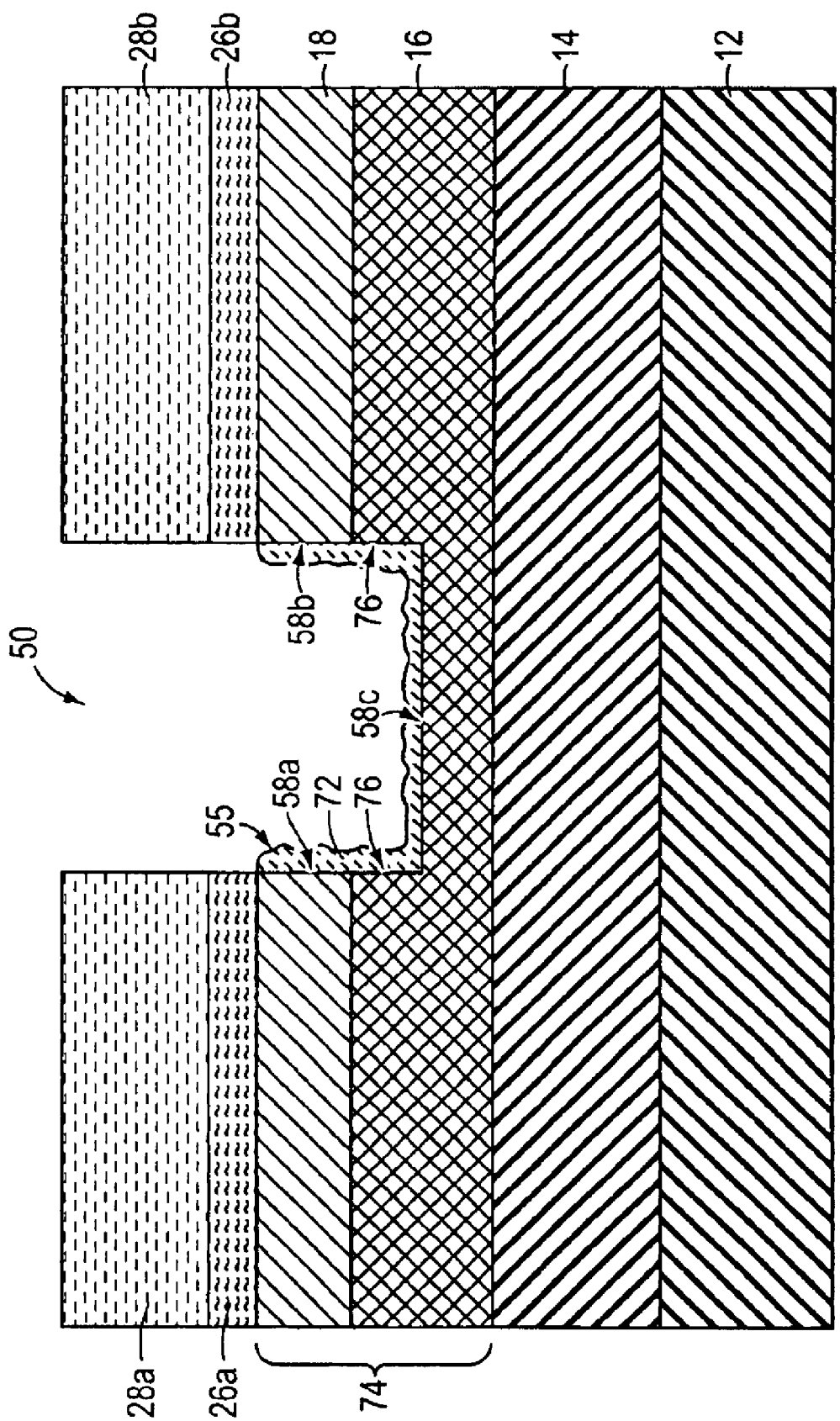
Figure 5B:
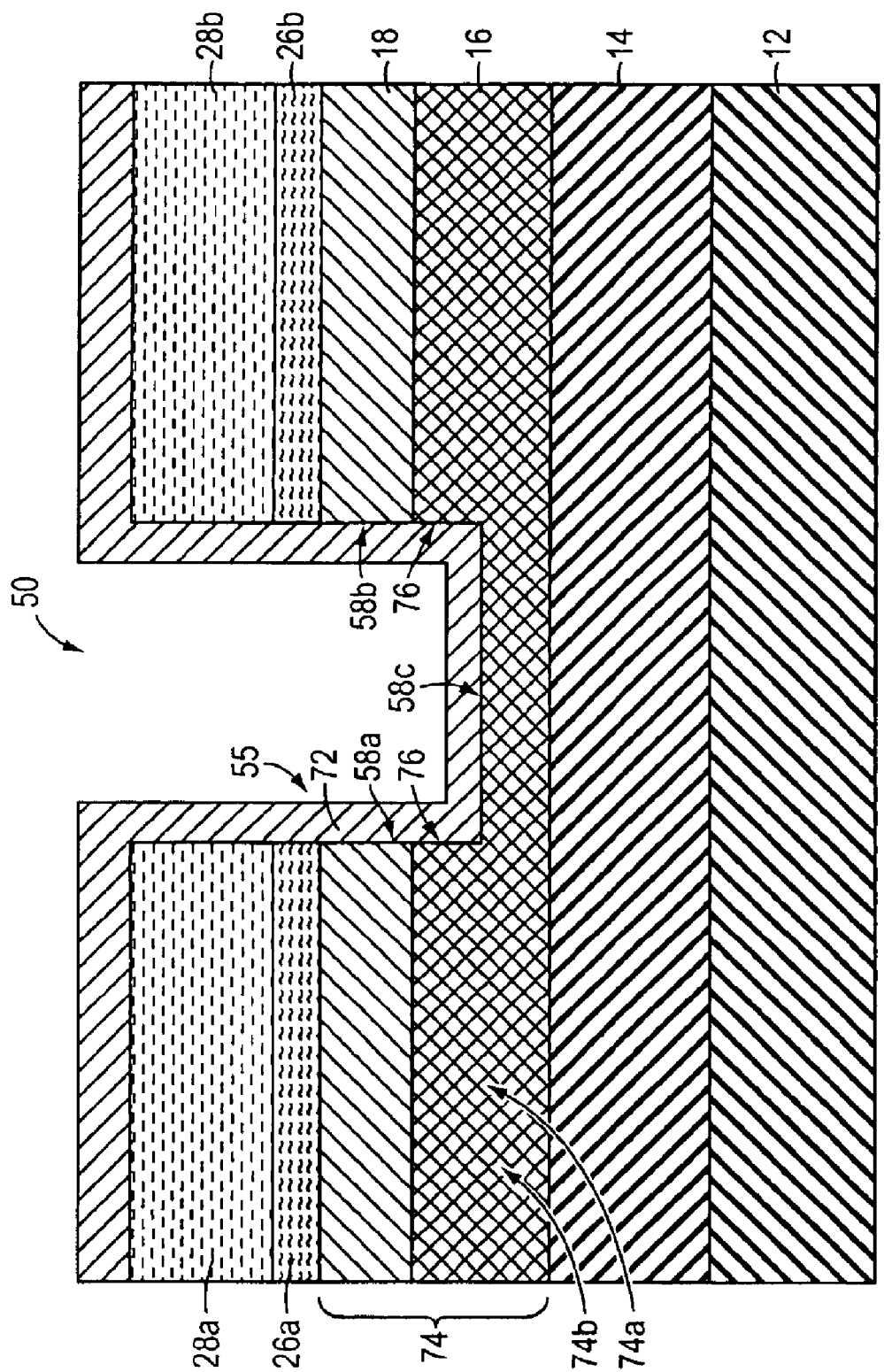

Referring to FIG. 5a, and also to FIG. 5b, trench structure 55 is formed in trench 50. Forming the trench structure 55 may include lining trench sidewalls 58a, 58b and trench bottom portion 58c with a first dielectric layer 72. First dielectric layer 72 may include an oxide, and it may be formed on any portion of strained layer 18 and relaxed layer 16 exposed in trench 50. First dielectric layer 72 may be e.g. 50–150 Å thick. In one embodiment, first dielectric layer 72 may include a nitrided oxide that may result in a lower interface state density than may be obtained with first dielectric layer 72 formed of pure silicon dioxide thermally grown on SiGe.

In one embodiment and referring to FIG. 5a, first dielectric layer 72 may be a thermally grown oxide, formed, for example, by thermal growth in a conventional furnace, such as the ALPHA-8SE manufactured by Tokyo Electron (Austin, Tex.). This oxidation step may take place in a wet, i.e., steam ambient, and/or at a low temperature, i.e., <1000° C. Alternatively, first dielectric layer 72 may be formed by rapid thermal oxidation to reduce STI-module thermal budget. A suitable processing system is the RADIANCE CENTURA system manufactured by Applied Materials (Santa Clara, Calif.). In this embodiment, the oxidation step may further utilize plasma enhancement to increase the oxidation rate. The rapid thermal oxidation may take place in a wet, i.e., steam ambient. Because the rapid thermal oxidation time is limited, e.g., 5 minutes or less, the oxidation may take place at higher temperatures, i.e., >1000° C., although it may still be preferable to carry out the oxidation at a lower temperature, i.e., <1000° C. In other embodiments, first dielectric layer may be formed by thermal oxidation in a dry, e.g., oxygen, ambient or may be formed at elevated pressures, e.g., high-pressure oxidation (HIPOX).

These thermal oxidation processing parameters may permit the incorporation into the oxide of elements, including elements other than Si, disposed in substrate 12. For example, in some embodiments, substrate 12 with layers 13 may be a SiGe virtual substrate and first dielectric layer 72 may include Ge. The ratio of Ge to Si in first dielectric layer 72 may be substantially similar to the ratio of Ge to Si in a substrate portion 74 that includes relaxed layer 16 and strained layer 18. More specifically, first dielectric layer 72 may be an oxide in the form of $Si_{1-x}Ge_xO_2$. Further, an interface 76 between first dielectric layer 72 and trench sidewalls 58a, 58b may have a satisfactory integrity with a low interface trap density, e.g., less than $5 \times 10^{11}/cm^2$.

In another embodiment and referring to FIG. 5b, first dielectric layer 72 may include an oxide, such as $SiO_2$, formed by a suitable deposition method such as LPCVD or PECVD. In this embodiment, first dielectric layer 72 may be pure $SiO_2$, i.e., it may not include Ge. Because first dielectric layer 72 is deposited, the formation of first dielectric layer 72 does not substantially affect the composition of substrate portion 74 at interface 76 between first dielectric layer 72 and trench sidewalls 58a, 58b. More specifically, a first region 74a of substrate portion 74 proximate the interface 76 may have a Ge concentration substantially similar to a Ge concentration in a second region 74b of substrate portion 74 distal the interface 76. The interface 76 between first dielectric layer 72 and trench sidewalls 58a, 58b may have a satisfactory integrity with a low interface trap density, e.g., less than $5 \times 10^{11}/cm^2$. In some embodiments, deposition of first dielectric layer 72 may be followed by an oxidation step to further improve the integrity of interface 76.

Figure 6:
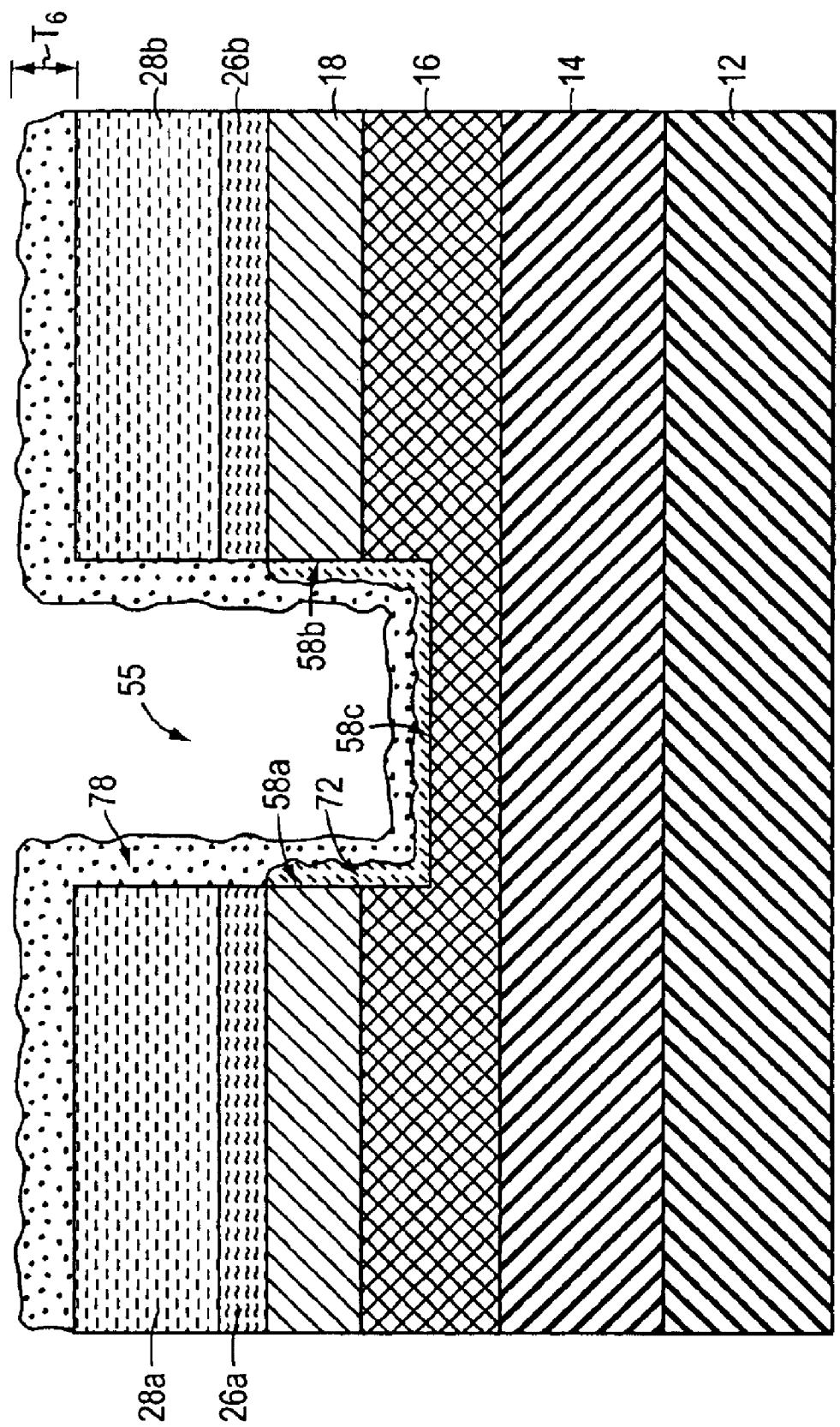

Referring to FIG. 6, in some embodiments, trench structure 55 may include a secondary protective liner 78 formed proximate first dielectric layer 72. This protective liner 78, preferably a dielectric material such as silicon nitride or silicon dioxide, may be deposited conformally over first dielectric layer 72. Protective liner 78 may have a thickness $T_6$ of, e.g., 50–500 Å. Because in some embodiments first dielectric layer 72 may contain Ge, it may be susceptible to attack by etchants used during subsequent processing, e.g., wet cleans such as hydrofluoric acid or even rinses in deionized water. Protective liner 78 may be selected to have a lower etch rate than first dielectric layer 72 in wet etchants such as hydrofluoric acid, or an RCA SC1 clean including water, hydrogen peroxide, and ammonium hydroxide. The formation of the second&y protective liner 78 may thus help to protect first dielectric layer 72 from accelerated etching, thereby preserving the integrity of first dielectric layer 72 during subsequent process steps. Protective liner 78 may also protect the sidewalls 58a, 58b of trench 50 from oxidation during subsequent process steps performed at elevated temperatures and/or in ambients containing oxygen. The volume expansion from such oxidation may result in unwanted compressive strain being induced in the region bounded by the trench structure or in the channel region of subsequently fabricated devices.

Materials and methods of forming dielectric layer 72 (and optionally protective liner 78) may be tailored to define trench structure 55 having the same type of strain as that in a particular layer of the substrate. For example, when strained layer 18 is compressively strained, dielectric layer 72 may be formed in a manner and of a material that will result in it also being compressively strained. In another embodiment, strained layer 18 may be tensilely strained, and dielectric layer 72 may be formed in a manner and of a material that will result in it also being tensilely strained.

In some embodiments, trench structure 55 may include both first dielectric 72 and protective liner 78, and the two layers may exert the same type of strain or different types of strain. Having different types of strain in first dielectric 72 and protective liner 78 may be advantageous. For example, when first dielectric 72 is formed in a steam ambient, compressive strain may be created in trench structure 55 and may affect device performance. Protective liner 78 may help to counteract this compressive strain by providing a tensilely strained layer. The total amount of strain of first dielectric 72 and protective liner 78 is preferably the same type of strain as the type of strain in one of the plurality of layers 13 on substrate 12, for example, strained layer 18.

Figure 7:
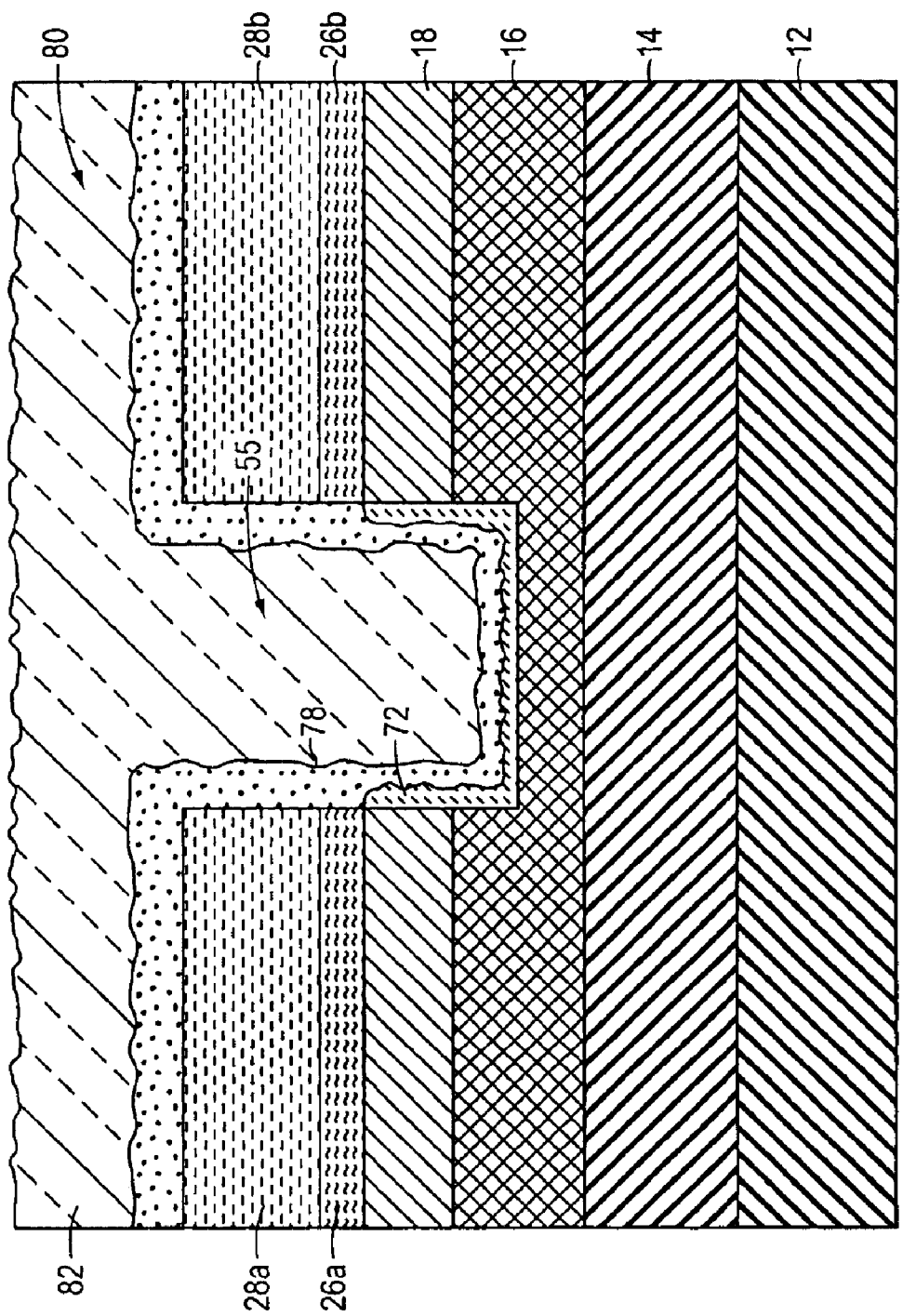

Referring to FIG. 7, trench 50 may be filled with a fill material 80 selected to define a trench structure 55 having the same type of strain as that in one of the plurality of layers 13 disposed over substrate 12. In one embodiment, the fill material 80 is a dielectric, such as silicon dioxide. Fill material 80 may be deposited by, for example, LPCVD, PECVD, or HDPCVD, and may have a thickness sufficient to completely fill trench 50. Alternatively, fill material 80 may be deposited by a spin-on process, e.g., fill material 80 may be a spin-on-glass material such as an inorganic spin-on-glass based on polysilazane. A portion 82 of fill material 80 may be disposed outside trench 50.

In an embodiment in which it is desired that trench structure 55 induce tensile strain, fill material 80 may include an amorphous semiconductor, e.g., amorphous silicon. In a subsequent step (either an additional step, or during a further processing step), fill material 80 may be heated to a temperature above its amorphous-polycrystalline phase transition temperature by annealing or by irradiation with ultraviolet or laser energy. Depending on the method, this may include heating fill material 80 to a temperature higher than approximately 500–700° C. During the phase transition that takes place above its amorphous-polycrystalline phase transition temperature, fill material 80 contracts, inducing tensile strain in a region bounded by trench structure 55, e.g., in a channel region of a subsequently fabricated device.

In an alternative embodiment, fill material 80 has a thermal expansion coefficient greater than that of the material within which it is predominantly formed (i.e. strained layer 18, relaxed layer 16, or substrate 12) and it is deposited at elevated temperatures. Depending on the materials present in strained layer 18, relaxed layer 16, and substrate 12, fill material 80 may be selected to have a coefficient of thermal expansion greater than that of Si ($2.6 \times 10^{-6}/°$ C.), Ge ($5.8 \times 10^{-6}/°$ C.), or GaAs ($6.86 \times 10^{-6}/°$ C.). In the case of trench 50 being formed predominately in SiGe, the coefficient of thermal expansion of the SiGe may be approximated as the weighted average of the coefficients of thermal expansion of Si and Ge. Because coefficients of thermal expansion for these materials tend to increase with temperature, fill material 80 may be chosen to have a coefficient of thermal expansion greater than $8 \times 10^{-6}/°$ C. In this embodiment, when fill material 80 is cooled to room temperature, it contracts more than the surrounding material, inducing tensile strain in a region bounded by trench structure 55, e.g., in the channel region of a subsequently fabricated device. A material suitable for use as fill material 80 may be zinc-alumina-silicate glass.

In another embodiment, fill material 80 is not fully densified, e.g., fill material 80 may include low temperature oxide (LTO), medium temperature oxide (MTO), or silicon dioxide deposited from a tetraethylorthosilicate (TEOS) precursor. An anneal at a temperature above the deposition temperature, e.g., above 700° C., may cause fill material 80 to densify, i.e., contract, thereby inducing tensile strain in the region bounded by trench structure 55, e.g., in the channel region of a subsequently fabricated device. Such a densification anneal is preferably performed at a temperature sufficiently low, e.g., below 1100–1200° C., to prevent strain relief by flow of fill material 80.

In an embodiment, trench structure 55 induces compressive strain, and fill material 80 with a coefficient of thermal expansion smaller than that of the surrounding material may be deposited at elevated temperature. For example, when the surrounding material is predominantly silicon, the fill material 80 may be silicon dioxide. Thus, when fill material 80 is cooled to room temperature, it contracts less than the surrounding material, inducing compressive strain in the region bounded by trench structure 55, e.g., in the channel region of a subsequently fabricated device. In an alternative embodiment, fill material 80 may induce tensile strain as-deposited and may be densified or annealed at high temperatures, e.g., above 900° C. Flow of fill material 80 at such high temperatures may result in compressive strain being induced by fill material 80 after cooling. In another embodiment, compressive silicon dioxide may be deposited by PECVD. In an alternative embodiment, protective liner 78 may be absent in trench 50, and an oxidation step may be performed after filling the trench with fill material 80. Such oxidation is accompanied by a volume expansion which may further induce compressive strain in the region bounded by trench structure 55, e.g., in the channel region of a subsequently fabricated device.

Figure 8:
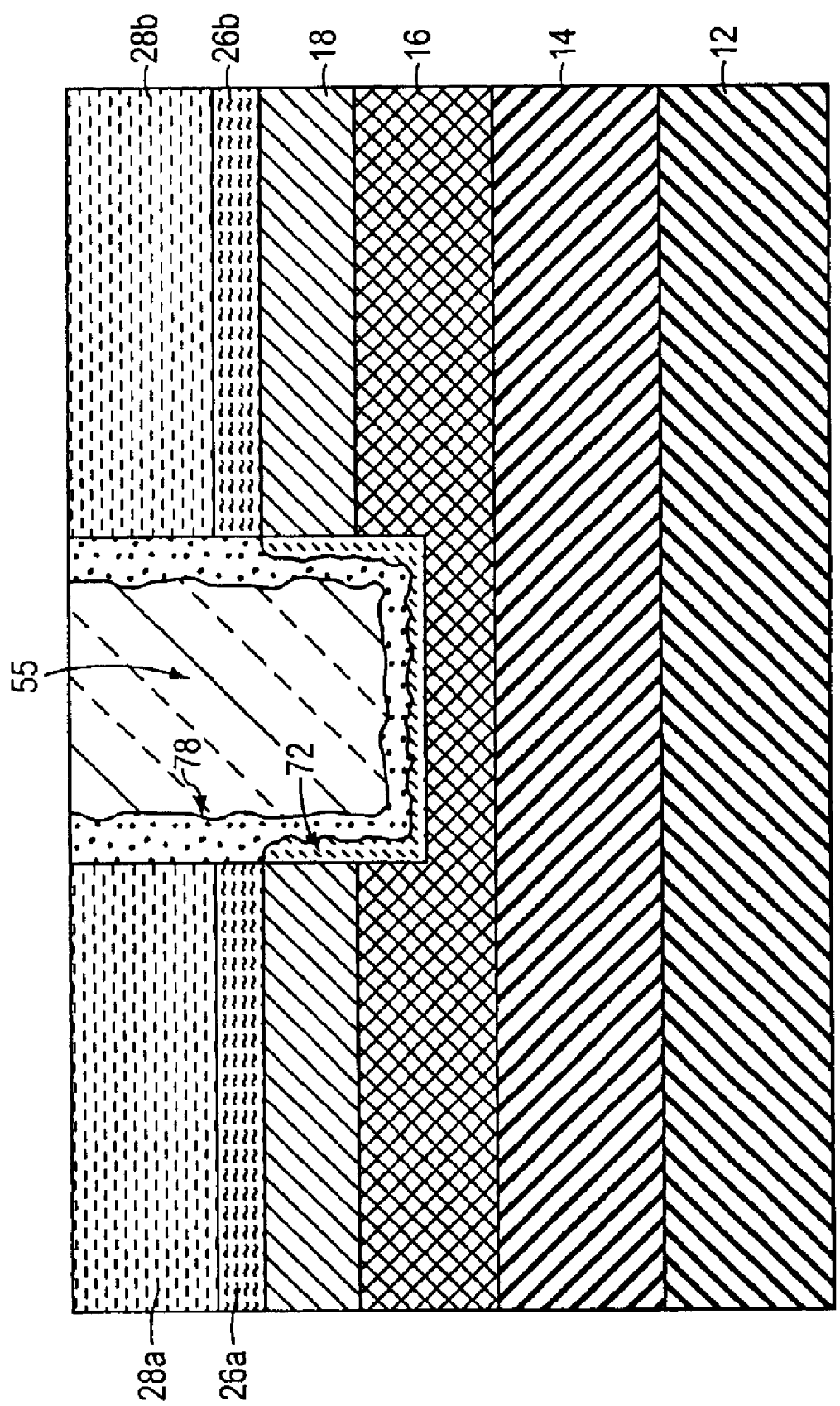

Referring to FIG. 7 and also to FIG. 8, portion 82 of fill material 80 disposed outside trench 50 is removed, e.g., by CMP.

Figure 9:
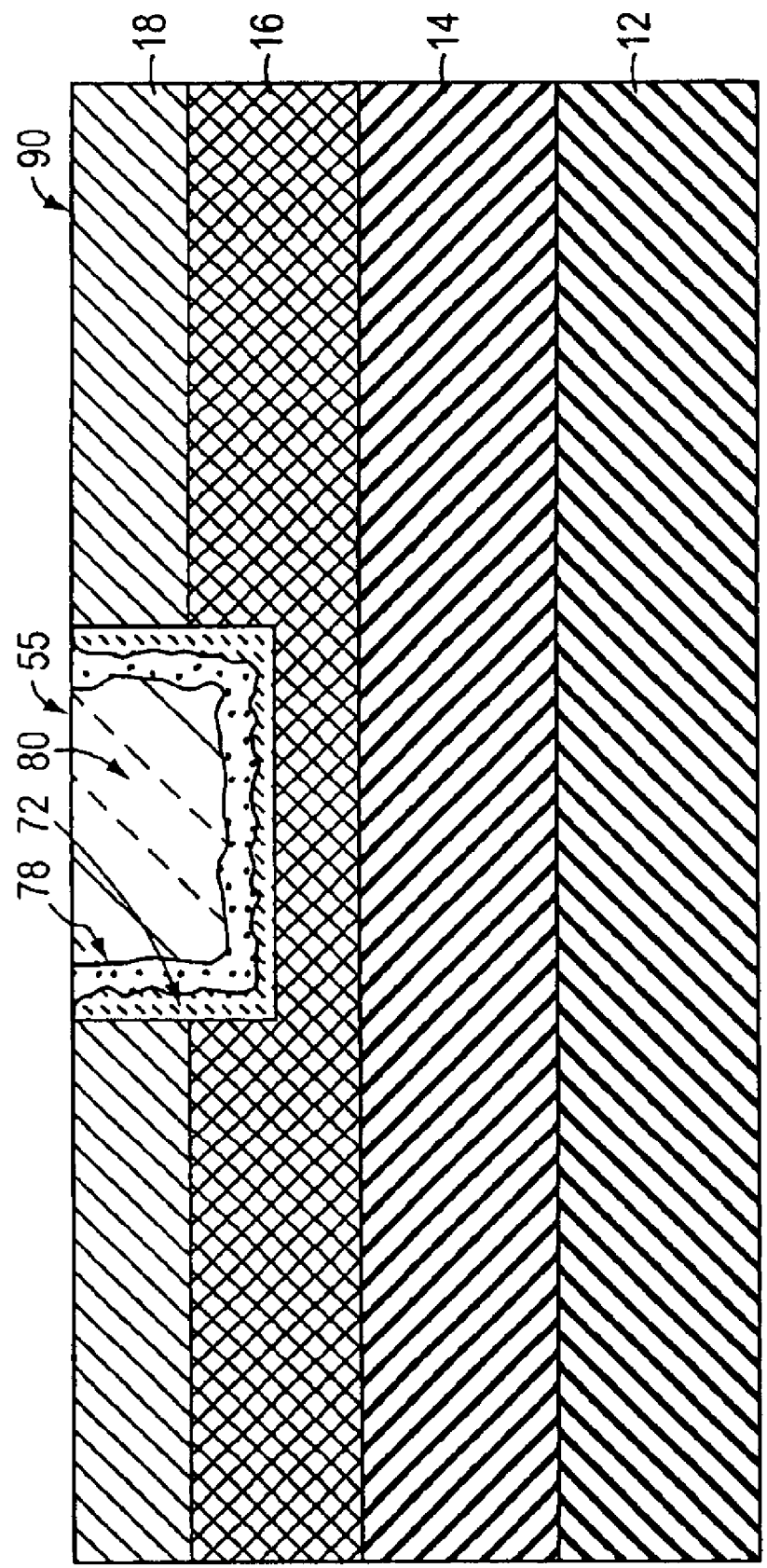

Referring to FIG. 8 and also to FIG. 9, remaining masking layer portions 28a, 28b and pad oxide portions 26a, 26b are removed, exposing a top surface 90 of strained layer 18, and leaving trench 50 filled with fill material 80, liner oxide 72, and in some embodiments, protective liner 78. Masking layer portions 28a, 28b may be removed by a removal process such as RIE using gases such as a combination of nitrogen trifluoride, ammonia, and oxygen, or a combination of hydrogen bromide, chlorine, and oxygen. Pad oxide portions 28a, 28b may be removed by a wet etch that is selective to silicon, such as a hydrofluoric acid etch. After removal of masking layer portions 28a and 28b and pad oxide portions 26a and 26b, a portion of fill material 80 may extend above top surface 90.

Figure 10A:
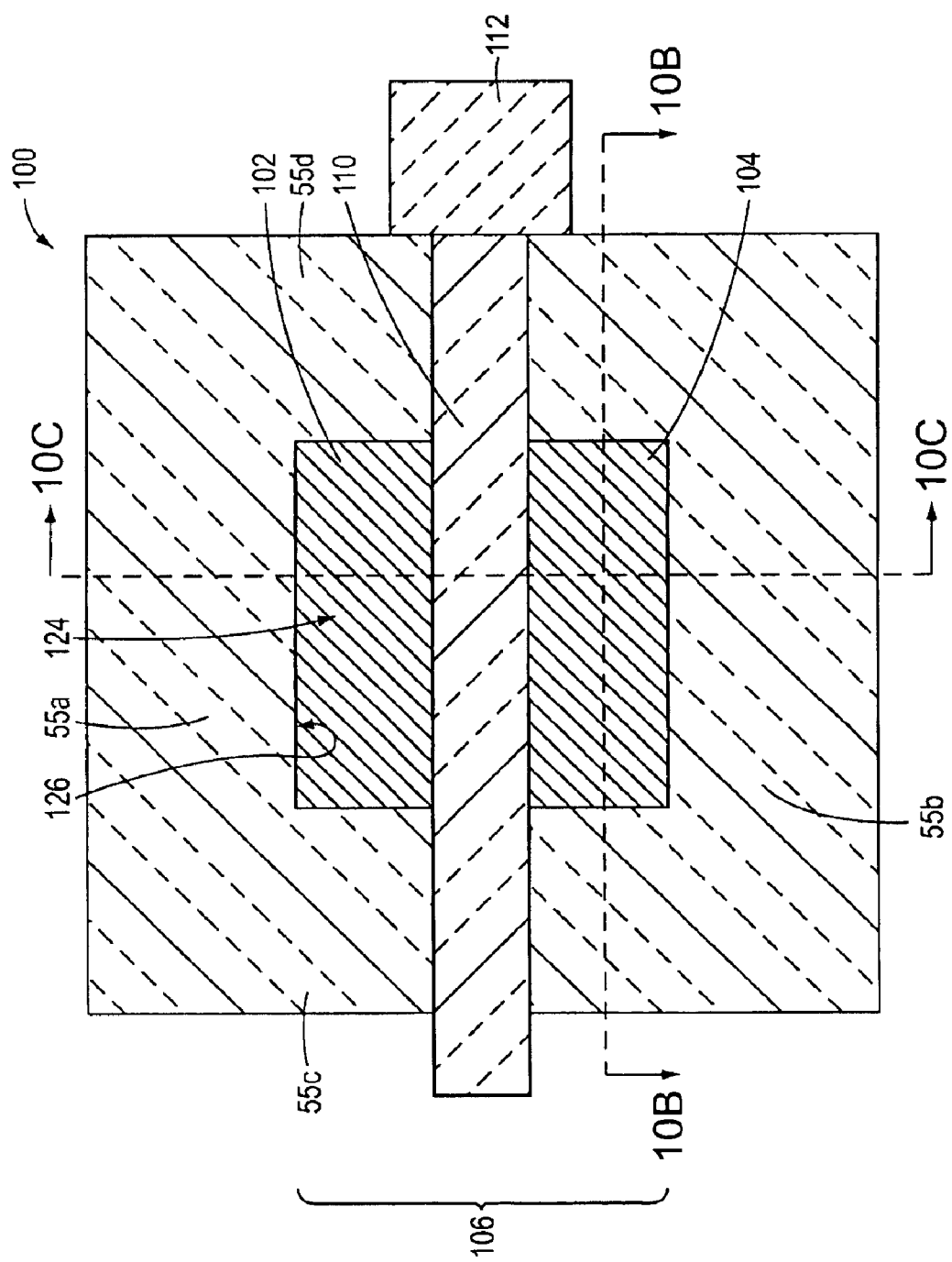
Figure 10B:
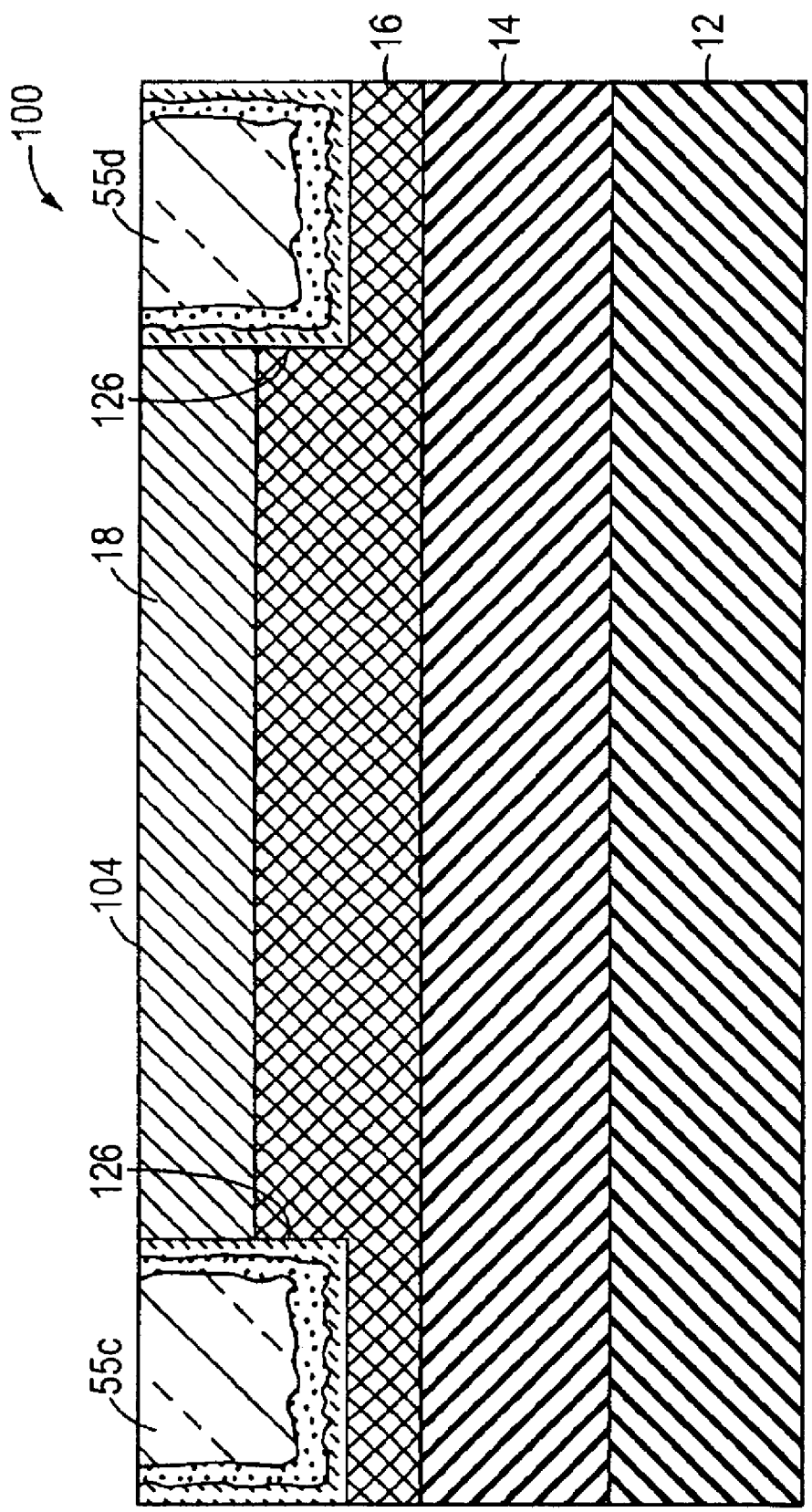
Figure 10C:
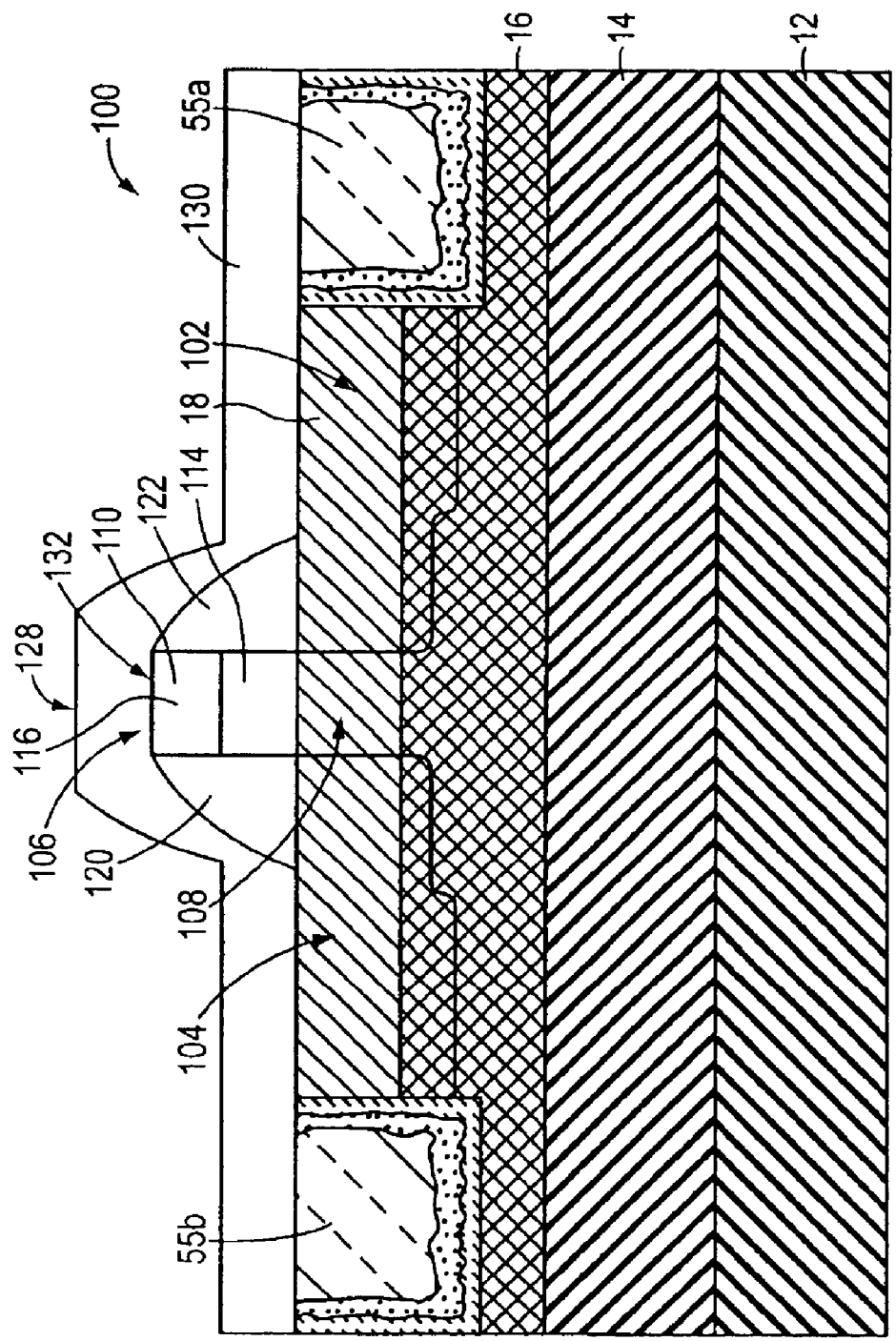

Referring to FIGS. 10a–10c, a structure 100 may include first and second parallel isolation trench structures 55a, 55b proximate a first source region 102 and a first drain region 104 of a first transistor 106. A first channel region 108 may be disposed between the first source and drain regions 102, 104. First channel region 108 may have a first type of strain. In some embodiments, the first type of strain may be tensile. In other embodiments, the first type of strain may be compressive. At least a portion of the first channel region 108 may be disposed in strained layer 18. A first gate 110 may be disposed above the channel region 108 and between the source and drain regions 102, 104. Gate 110 may be connected to a gate contact 112. A first gate dielectric layer 114 may be formed between gate 110 and channel region 108. First gate 110 and first gate dielectric layer 114 may be collectively referred to as a first gate structure 116. A first and a second sidewall spacer 120, 122 may be formed proximate gate structure 116.

First transistor 106 may be formed on layers 13 disposed over substrate 12. As discussed above with reference to FIG. 1a, layers 13 may include, for example, graded layer 14, relaxed layer 16, and strained layer 18. In other embodiments, first transistor 106 may be formed on an SSOI substrate 22, as shown in FIG. 1c. Source region 102, channel region 108, and drain region 104 may be formed in a portion of the SSOI substrate 22, for example, in a portion of strained layer 18.

Source and drain regions 102, 104 may be formed by, e.g., ion implantation of either n-type or p-type dopants. Gate 110 may be formed of a conductive material, such as doped semiconductor, e.g., polycrystalline Si or polycrystalline SiGe; a metal, e.g., titanium (Ti), tungsten (W), molybdenum (Mo), tantalum (Ta), nickel (Ni), or iridium (Ir); or metallic compounds, e.g., titanium nitride (TiN), titanium silicon nitride (TiSiN), tungsten nitride (WN), tantalum nitride (TaN), tantalum silicide (TaSi), nickel silicide (NiSi), or iridium oxide ($IrO_2$), that provide an appropriate workfunction. The gate dielectric layer 114 may be formed on strained layer 18 by, for example, growing a $SiO_2$ layer by thermal oxidation. Alternatively, gate dielectric layer 114 may include a high-k material with a dielectric constant higher than that of $SiO_2$, such as $ZrO_2$, $Al_2O_3$, $HfO_2$, HfSiON, or $HfSiO_4$. In some embodiments, gate dielectric layer 114 may be a stacked structure, e.g., a thin $SiO_2$ layer capped with a high-k material.

First and second trench structures 55a, 55b confine carriers (not shown), such as holes or electrons generated during operation of first transistor 106, within a region 124 having an outer semiconductor/insulating boundary 126 defined by first and second trench structures 55a, 55b and by adjacent third and fourth trench structures 55c, 55d. By confining carriers to region 124, trench structures 55a–55d help prevent further migration of the carriers, and thereby prevent leakage currents between first transistor 106 and other devices (not shown). The shallow trench isolation provided by first, second, third, and fourth trench structures 55a–55d is inadequate if the edge-leakage current associated with a high interface trap density at the semiconductor/insulating boundary 126 is sufficient to significantly increase the off-state current ($I_{off}$) of transistor 106. On the other hand, this isolation suffices if the edge-leakage current associated with a low interface trap density at the semiconductor-trench boundary 126 ensures a low $I_{off}$ for first transistor 106. $I_{off}$ is affected by the edge-leakage that occurs underneath gate 110. A low interface trap density in the portions of boundary 126 disposed underneath gate 110, therefore, is critical for obtaining a low $I_{off}$. If the interface trap density in boundary 126 underneath gate 110 is low, leakage current cannot flow under gate 110 sufficiently to induce a high $I_{off}$. The $I_{off}$ may be less than $10^{-6}$ Ampere. In some embodiments, the off current is less than $10^{-9}$ Ampere.

Trench structures 55a–55d may include a first dielectric layer 72, and optionally a second protective liner 78. Parameters for forming trench structures 55a–55d may be selected such that one or more of the trench structures 55a–55d induces only a portion of the strain in channel region 108, but not the entire strain in channel region 108. For example, in an embodiment, channel region 108 may be compressively strained, and trench structures 55a–55d may be formed in a manner and of materials such that the trench structures 55a–55d are also compressively strained, and induce only a portion of the compressive strain in channel region 108. In another embodiment, channel region 108 may be tensilely strained, and trench structures 55a–55d may be formed in a manner and of materials such that the trench structures 55a–55d are also tensilely strained, and induce only a portion of the tensile strain in channel region 108. The portion of strain induced by trench structures 55a–55d may be between 0–99.9% of the strain in channel region 108.

As used herein, the term "active area length" refers to the dimension of the active device area bounded by trench structures 55a–55d parallel to the current flow and perpendicular to the gate. Referring to FIG. 10a, the active area length is along the 10c—10c line. The term "active area width" refers to the dimension of the active area bounded by trench structures 55a–55d parallel to the gate and perpendicular to the direction of the current flow. With reference to FIG. 10a, the active area width is along the 10b—10b line.

The use of trench structures to induce a portion of the strain in channel region 108 rather than inducing strain of the opposite type (e.g., inducing tensile strain in a compressively strained channel) may result in superior device performance, particularly when the dimensions of the active device area are scaled to small sizes. For example, device performance may be improved when the active area length is smaller than approximately 1 μm and/or the active area width is smaller than 0.5 μm.

As discussed above, in some embodiments, the strain in channel region 108 may arise from lattice mismatch between strained layer 18 and the underlying layers. In other embodiments, strained layer 18 may be a surface portion of substrate 12 upon which a transistor is fabricated. In such embodiments, the strain in channel region 108 may be induced by another structure, for example, a strain-inducing element 128, introduced during device fabrication. The strain in channel region 108 may be predominantly uniaxial. In other embodiments, the strain may be induced along multiple directions, e.g., the strain may be biaxial strain or hydrostatic strain.

As noted above, in some embodiments, a portion of the strain in channel region 108 may be induced by trench structures 55a–55d. In an embodiment, the portion of the strain induced in channel region 108 by trench structures 55a–55d may be approximately zero, and the strain in channel region 108 may be induced by other structures, for example, a strain-inducing element 128, introduced during device fabrication.

Various approaches may be used to tailor the strain induced by trench structures 55a–55d so that the induced strain is approximately zero. For example, the fill material in the trench structures 55a–55d may be selected to have a coefficient of thermal expansion to be approximately the same as the material surrounding the trenches 50, e.g., the fill material may include silicon when the trench is formed in a silicon substrate. Alternatively, the fill material may include two materials, with a first material having strain that is opposite to the strain of a second material.

With continued reference to FIG. 10c, in one embodiment, the strain is first channel region 108 is induced by a first cap layer 130, such as a layer used as an etch stop during contact metallization. Cap layer 130 may be conformally disposed over the entire device structure 100, e.g., over a surface 132 of first transistor 106, and may be formed from a dielectric material, e.g., silicon nitride, processed to induce tensile or compressive strain in channel region 108.

In an embodiment, cap layer 130 includes silicon nitride that may be processed to induce strain as previously described in the discussion of masking layer 28. Additionally, cap layer 130 may be implanted with atoms, e.g., Si or Ge atoms, to tailor the strain level induced in the channel region 108. In another embodiment, the strain in channel region 108 may be induced by the implantation of a gaseous species, e.g., hydrogen, oxygen, helium, or other noble gas, into gate 110 or into a region below channel region 108.

Gate 110 may also induce strain in channel region 108 if gate 110 is composed completely or nearly completely of a metal silicide, metal germanosilicide, or metal germanocide, e.g., nickel silicide (NiSi), nickel germanosilicide (NiSiGe), or nickel germanocide (NiGe). The reaction between the metal and the gate polycrystalline silicon, polycrystalline silicon-germanium, or polycrystalline germanium may result in a volumetric change that may induce strain in channel region 108 after processing. In an alternative embodiment, strain in gate 110 may be induced by deposition of an overlayer, e.g., an oxide, and annealing prior to complete or incomplete silicidation of the gate. Gate 110 may include a semiconductor material that has been amorphized, e.g., by an ion implantation step, and may undergo an amorphous-crystalline phase transition (and accompanying volumetric change) during a subsequent anneal. The presence of an overlayer during such an anneal may result in a strain being induced in channel region 108, even after the overlayer is removed and the gate is silicided.

Figure 10D:
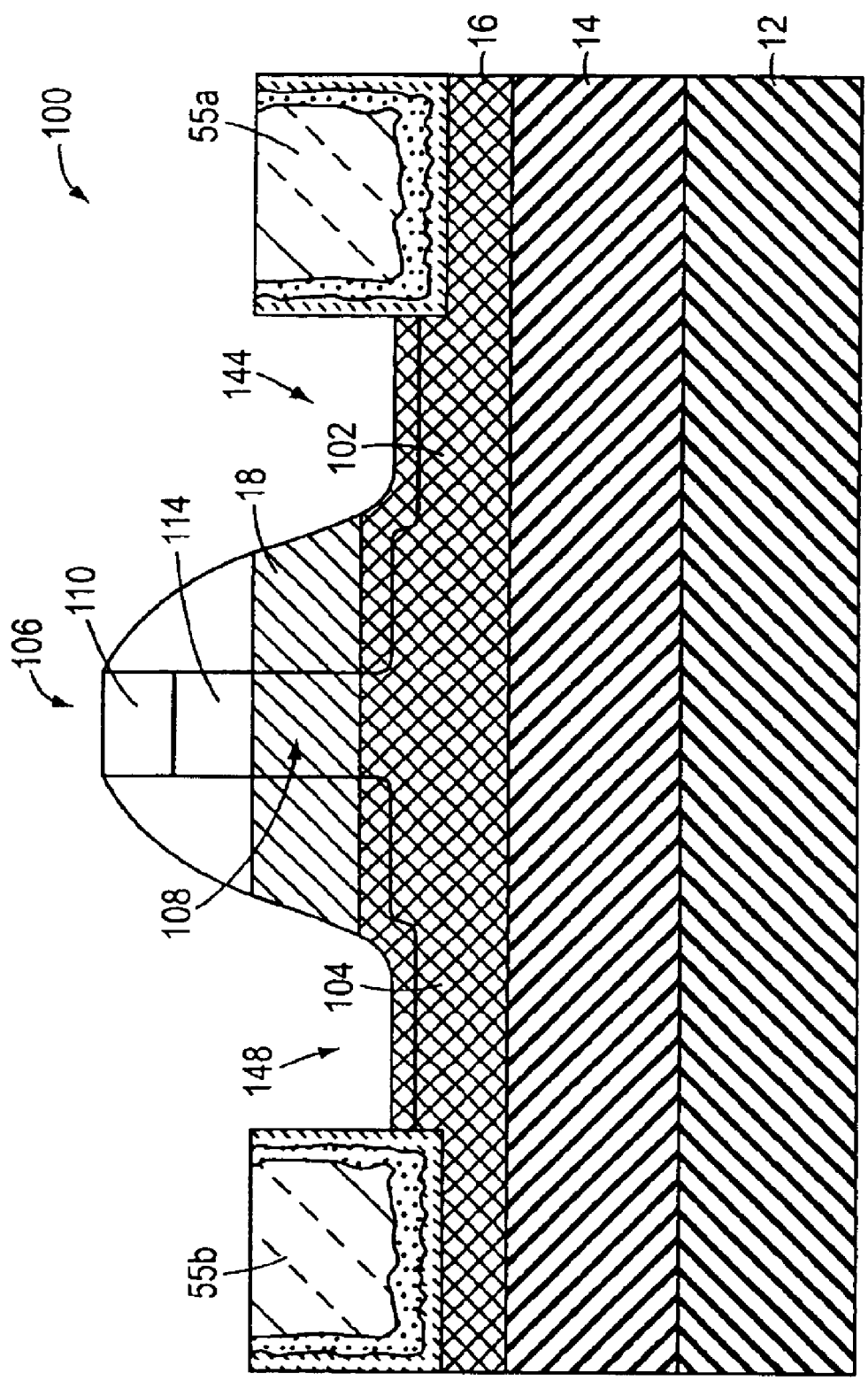
Figure 10E:
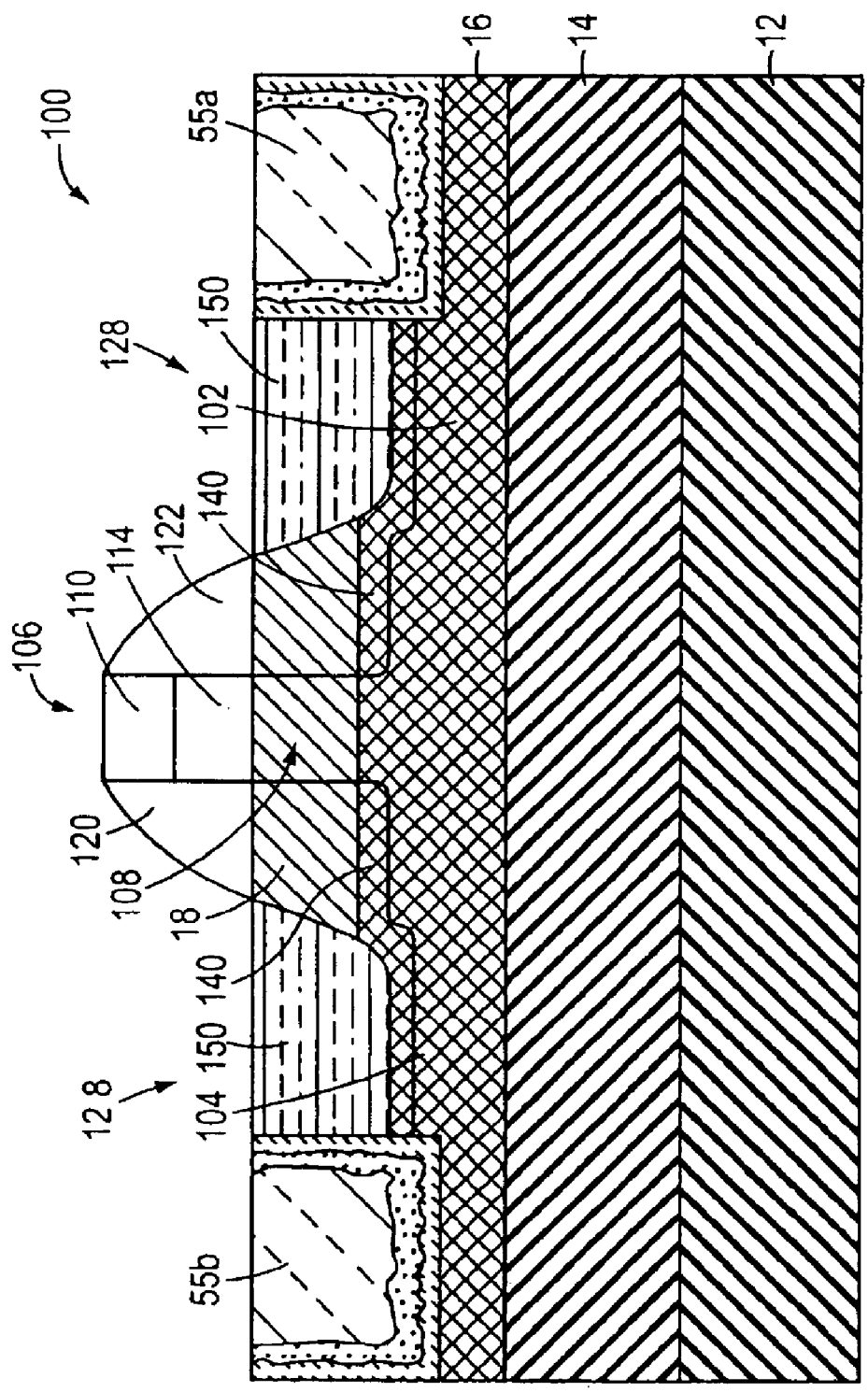

With reference to FIGS. 10d–10e, in another embodiment, the strain in channel region 108 may be induced by the replacement of a portion of the semiconductor material in source region 102 and drain region 104, with a second material having a lattice constant different from that of the semiconductor material disposed in the channel region 108 or in an area 140 proximate at least one of the first source region 102 and first drain region 104. For example, first and second recesses 144, 148 may be defined in source region 102 and drain region 104 that include Si (in which case channel region 108 also includes Si), as described in, e.g., U.S. Pat. Nos. 6,651,273 and 6,621,131, incorporated by reference herein. Recesses 144, 148 may be filled with a second material 150 with a lattice constant larger than that of Si, such as SiGe, thereby inducing compressive strain in channel region 108. Alternatively, recesses 144, 148 in source region 102 and drain region 104 that include Si may be etched and refilled with second material 150 with a smaller lattice constant, such as silicon carbide (SiC), thereby inducing tensile strain in channel region 108. For source, drain, and channel regions that include SiGe, the refill second material 150 may be Ge or SiGe with a higher Ge content for inducing compressive strain or Si or SiGe with a lesser Ge content for inducing tensile strain. Area 140 may be, for example, a portion of relaxed layer 16 and/or a portion of strained layer 18. In an embodiment, first transistor 106 is formed on a bulk semiconductor substrate 12, and area 140 may include a portion of the bulk semiconductor substrate 12.

In another embodiment, strain in channel region 108 may also be induced predominantly by a silicided region of source region 102 and/or drain region 104. Volumetric changes during the reaction of the silicide metal with the semiconductor material in source region 102 or drain region 104 may cause strain to be induced in channel region 108. Such metals may include titanium, nickel, cobalt, platinum or other suitable metals. In such embodiments, source region 102 and drain region 104 may not be etched and refilled with alternative semiconductor materials.

In another embodiment, strain-inducing element 128 may be introduced during back-end metallization steps or during die-level packaging of a chip including first transistor 106. For example, strain-inducing element 128 could be the package to which the chip is attached after the completion of device fabrication. Such a package can be engineered, e.g., deformed or strained, to induce strain across an entire chip along one or more directions, thereby inducing strain in channel region 108. For such embodiments, bulk semiconductor substrate 12 may have a reduced thickness, e.g., due to removal of material by backside grinding. In another embodiment, strain-inducing element 128 could be a metallization layer or a dielectric layer between metal wiring layers deposited and/or processed in a manner such that strain is induced in channel region 108.

The methods described herein by which strain is induced in channel region 108 may be used in combination with the epitaxial strained layer 18 described above, and/or with SSOI or SOI wafers.

Figure 11:
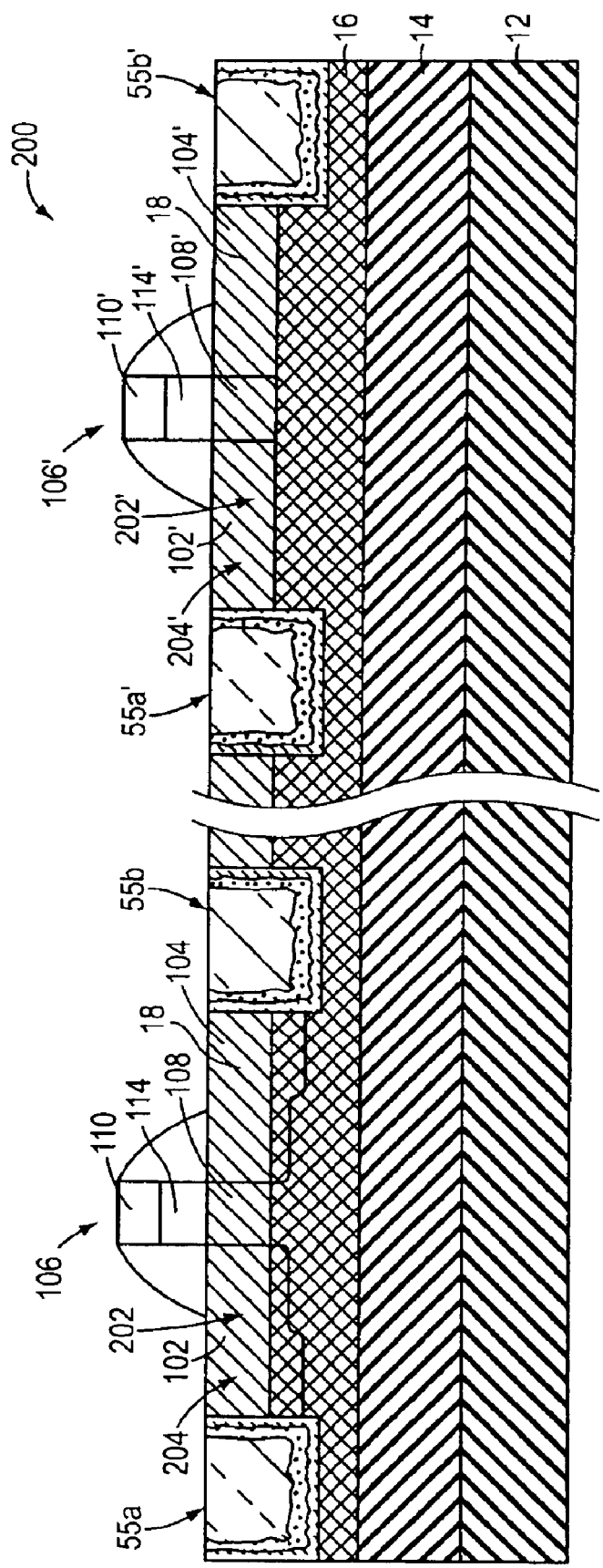
FIG. 11 is a cross-sectional view of a semiconductor structure including two transistors.

Referring to FIG. 11, a structure 200 may include a first transistor 106 and a second transistor 106'. The first transistor 106 may be disposed over a first region of substrate 12, for example, over a first region 202 of strained layer 18. Trench structures 55a and 55b may be formed proximate first source region 102 and first drain region 104. First source region 102 and first drain region 104 may, in turn, be disposed in a first portion of the substrate, for example, in a first portion 204 of strained layer 18. The second transistor 106' may be disposed over a second region of substrate 12, for example, over a second region 202' of strained layer 18. The second transistor 106' may include a second source region 102' and a second drain region 104' disposed in a second portion of the substrate, for example, in a second portion 204' of strained layer 18. The second transistor 106' also may include a second channel region 108' disposed between second source region 102' and second drain region 104'. In some embodiments, second channel region 108' may be tensilely strained. In other embodiments, second channel region 108' may be compressively strained. A second gate 110' may be disposed over second channel region 108' and between second source region 102' and second drain region 104'. The second gate 110' may include a material such as a doped semiconductor, a metal, and a metallic compound. A second gate dielectric 114' may be disposed between second gate 110' and second channel region 108'.

A second trench structure 55a' may be formed proximate at least one side of second source region 102' or second drain region 104'. A second pair of trench structures including trench structures 55a', 55b' may be formed proximate second source region 102' and second drain region 104'. In an embodiment, second channel region 108' may be compressively strained, and trench structures 55a', 55b' may be formed in a manner and of materials such that trench structures 55a', 55b' are also compressively strained, and induce a portion of the compressive strain in second channel region 108'. In another embodiment, second channel region 108' may be tensilely strained, and trench structures 55a', 55b' may be formed in a manner and of materials such that trench structures 55a', 55b' are also tensilely strained, and induce a portion of the tensile strain in second channel region 108'.

The first channel region 108 and the second channel region 108' may have the same or different types of strain. For example, in one embodiment, first channel region 108 may be compressively strained, while second channel region 108' is tensilely strained. In this embodiment, trench structures 55a, 55b may be formed in a manner and of materials such that trench structures 55a and 55b are compressively strained, and induce a portion of the compressive strain in first channel region 108. Trench structures 55a', 55b' may be formed in a manner and of materials such that trench structures 55a', 55b' are tensilely strained, and induce a portion of the tensile strain in second channel region 108'.

In the case of first channel region 108 and second channel region 108' having different types of strain, it may be advantageous in terms of process simplicity for trench structures 55a, 55b, 55a', 55b' to induce approximately no strain on channel regions 108 and 108'. In this case, the strain in strained layer 18 may be augmented with another strain-inducing technique described above, e.g., cap layer 130, strain-inducing gate 110, or etched and refilled source and drain regions 102 and 104. In an embodiment, first transistor 106 could include first channel region 108 in strained layer 18 that is tensilely strained, cap layer 130 that induces tensile strain, and trench structures 55a, 55b that induce little or no strain on first channel region 108. Second transistor 106' could include second channel region 108' in strained layer 18 that is compressively strained, source and drain regions 102', 104' comprising a material with a larger lattice constant than that of surrounding material (at least one of strained layer 18 and relaxed layer 16) and hence inducing compressive strain in second channel region 108', and trench structures 55a', 55b' that induce little or no strain on second channel region 108'. These methods may also be utilized on SSOI substrates.

The use of these composite techniques to cooperatively induce the strain in channel region 108 rather than inducing strain of opposite types (e.g., inducing tensile strain in a compressively strained channel) may result in superior device performance, particularly when the dimensions of the active device area are scaled to small sizes. For example, device performance may be improved when the active area length is smaller than approximately 1 $\mu$m and/or the active area width is smaller than 0.5 $\mu$m.

In some embodiments, either or both of the gates of transistors 106, 106' may be oriented along crystallographic directions offset from the customary in-plane [110] direction. For example, a transistor gate may be aligned to an in-plane [100] direction on a (100) Si wafer. In other embodiments, a substrate having a surface other than the customary (100) surface may be used in the manufacture of transistors 106, 106'. For example, a substrate with a (110) or (111) surface may be used. For the case of a SOI or SSOI substrate, a layer above the insulating layer may have an in-plane rotation with respect to an underlying substrate (i.e., the crystallographic directions in the layer may be different from that of the substrate) or may have surface crystallographic planes other than those of the underlying substrate. For example, a semiconductor layer may be rotated 45° in-plane prior to bonding to form an SOI or SSOI substrate. Alternatively, a semiconductor (strained or unstrained) may be formed with an alternative surface crystallographic plane (e.g., (110) or (111)) and bonded to a handle wafer (e.g., with a (100) surface).

Embodiments of this invention may also be applicable to transistors with multiple or wrap-around gates. Examples of these include fin-FETs, tri-gate FETs, omega-FETs, and double-gate FETs (the channels of which may be oriented horizontally or vertically).

The invention may be embodied in other specific forms without departing from the spirit or essential characteristics thereof. The foregoing embodiments are therefore to be considered in all respects illustrative rather than limiting on the invention described herein.

What is claimed is:

1. A structure comprising:
   a substrate;
   a first transistor disposed over a first region of the substrate, the first transistor including:
      a first source region and a first drain region disposed in a first portion of the substrate,
      a first channel region disposed between the first source region and the first drain region, the first channel region having a first type of strain, and
      a first gate disposed above the first channel region and between the first source and first drain regions, the first gate comprising a material selected from the group consisting of a doped semiconductor, a metal, and a metallic compound; and
   a first trench structure disposed in a trench, wherein the trench is proximate at least one side of one of the first source region and the first drain region, the first trench structure inducing only a portion of the first type of strain in the first channel region.

2. The structure of claim 1, further comprising:
   a strained layer disposed over the substrate.

3. The structure of claim 2 wherein the strained layer comprises at least one of silicon and germanium.

4. The structure of claim 2 wherein at least a portion of the first channel region is disposed in the strained layer.

5. The structure of claim 2, further comprising:
   a dielectric layer disposed over the substrate,
   wherein the strained layer is disposed over and in contact with the dielectric layer.

6. The structure of claim 1 wherein the first type of strain is tensile.

7. The structure of claim 1 wherein the first type of strain is compressive.

8. The structure of claim 1 wherein the substrate comprises at least one of silicon and germanium.

9. The structure of claim 1 wherein the substrate comprises at least one element other than silicon.

10. The structure of claim 9 wherein the other element is germanium.

11. The structure of claim 1, further comprising:
    a first cap layer disposed over a surface of the first transistor,
    wherein the strain in the first channel region is induced by the first cap layer.

12. The structure of claim 11 wherein the first cap layer comprises silicon nitride.

13. The structure of claim 1 wherein the strain in the first channel region is induced by at least one of the first source region and the first drain region.

14. The structure of claim 13 wherein the at least one of the first source region and the first drain region comprises a second material having a larger lattice constant than a lattice constant of a semiconductor material disposed in at least one of the first channel region and an area proximate at least one of the first source region and the first drain region.

15. The structure of claim 14 wherein the second material comprises a material selected from the group consisting of SiGe and Ge.

16. The structure of claim 13 wherein the at least one of the first source region and the first drain region comprises a second material having a smaller lattice constant than a lattice constant of a semiconductor material disposed in at least one of the first channel region and an area proximate at least one of the first source region and the first drain region.

17. The structure of claim 16 wherein the second material comprises a material selected from the group consisting of SiGe, Si, and SiC.

18. The structure of claim 1 wherein the strain in the first channel region is induced by the first gate.

19. The structure of claim 18 wherein the first gate comprises material selected from the group consisting of metal silicide, metal germanosilicide, and metal germanocide.

20. The structure of claim 1, further comprising:
    a second transistor disposed over a second region of the substrate, the second transistor including:
       a second source region and a second drain region disposed in a second portion of the substrate,
       a second channel region disposed between the second source region and the second drain region, the second channel region having a second type of strain, and
       a second gate disposed above the second channel region and between the second source and second drain regions, the second gate comprising a material selected from the group consisting of a doped semiconductor, a metal, and a metallic compound; and
    a second trench structure disposed in a trench, wherein the trench is proximate at least one side of one of the second source region and the second drain region, the second trench structure inducing only a portion of the second type of strain in the second channel region.

21. The structure of claim 20 wherein the first and second types of strain are different.

22. The structure of claim 1 wherein the portion of the strain induced by the first trench structure is approximately zero.

23. The structure of claim 22, further comprising:
    a first strain-inducing element; and
    a first epitaxial strained layer,
    wherein the first channel region is disposed within a portion of the first epitaxial strained layer and the first strain-inducing element induces only a portion of the strain in the first channel region.

24. The structure of claim 23 wherein the first strain-inducing element comprises a first cap layer disposed over a surface of the first transistor.

25. The structure of claim 23 wherein the first strain-inducing element comprises the first gate.

26. The structure of claim 23 wherein the first strain-inducing element comprises at least one of the first source region and the first drain region.

27. A method for forming a semiconductor structure, the method comprising:
    providing a substrate;
    forming a first transistor over a first region of the substrate by:
       defining a first source region and a first drain region in a first portion of the substrate,
       defining a first channel region between the first source region and the first drain region, the first channel region having a first type of strain, and
       forming a first gate above the first channel region and between the first source and first drain regions, the first gate comprising a material selected from the group consisting of a doped semiconductor, a metal, and a metallic compound;
    forming a first trench proximate at least one side of one of the first source region and the first drain region; and
    forming a first trench structure in the first trench, the first trench structure tailored to induce only a portion of the first type of strain in the first channel region.

28. The method of claim 27, further comprising:
forming a second transistor over a second region of the substrate by:
  defining a second source region and a second drain region in a second portion of the substrate,
  defining a second channel region between the second source region and the second drain region, the second channel region having a second type of strain, and
  forming a second gate above the second channel region and between the second source and second drain regions, the second gate comprising a material selected from the group consisting of a doped semiconductor, a metal, and a metallic compound;
forming a second trench proximate at least one side of one of the second source region and the second drain region; and
forming a second trench structure in the second trench, the second trench structure tailored to induce only a portion of the second type of strain in the second channel region.

29. The method of claim 28 wherein the first and second types of strain are different.

30. The method of claim 27, further comprising:
forming a first cap layer over a surface of the first transistor, the cap layer tailored to induce the first type of strain in the first channel region.

31. The method of claim 27 wherein at least a portion of the strain in the first channel region is induced by at least one of the first source region and the first drain region.

32. The method of claim 31 wherein the at least one of the first source region and the first drain region comprises a second material having a larger lattice constant than a lattice constant of a semiconductor material disposed in at least one of the first channel region and an area proximate at least one of the first source region and the first drain region.

33. The method of claim 31 wherein the at least one of the first source region and the first drain region comprises a second material having a smaller lattice constant than a lattice constant of a semiconductor material disposed in at least one of the first channel region and an area proximate at least one of the first source region and the first drain region.

34. The method of claim 27 wherein at least a portion of the strain in the first channel region is induced by the first gate.

35. The method of claim 27 wherein the portion of the first type of strain the first trench structure is tailored to induce is approximately zero.

36. The method of claim 35 wherein the first channel region is defined in a portion of a first epitaxial strained layer.

37. The method of claim 35, further comprising:
providing a first strain-inducing element.

38. The method of claim 37 wherein the first strain-inducing element comprises a first cap layer disposed over a surface of the first transistor.

39. The method of claim 37 wherein the first strain-inducing element comprises the first gate.

40. The method of claim 37 wherein the first strain-inducing element comprises at least one of the first source region and the first drain region.

* * * * *